United States Patent [19]

MacCrisken

[11] Patent Number: 4,730,348
[45] Date of Patent: Mar. 8, 1988

[54] ADAPTIVE DATA COMPRESSION SYSTEM

[75] Inventor: John E. MacCrisken, Palo Alto, Calif.

[73] Assignee: Adaptive Computer Technologies, Santa Clara, Calif.

[21] Appl. No.: 909,281

[22] Filed: Sep. 19, 1986

[51] Int. Cl.$^4$ .................................... H04L 23/00
[52] U.S. Cl. ................................. 375/122; 370/83; 370/118; 371/33; 364/200
[58] Field of Search ............... 375/58, 122; 370/79, 370/82, 83, 94, 99, 118; 371/32, 33; 358/133, 138, 260; 340/347 DD; 382/43, 56

[56] References Cited

U.S. PATENT DOCUMENTS

| | | | |
|---|---|---|---|
| 3,237,170 | 2/1966 | Blasbalg et al. | 364/200 |
| 3,694,813 | 9/1972 | Loh et al. | 364/200 |
| 3,717,851 | 2/1973 | Cocke et al. | 364/200 |
| 4,082,922 | 4/1978 | Chu | 371/33 |
| 4,156,111 | 5/1979 | Downey et al. | 370/33 |
| 4,494,108 | 1/1985 | Langdon, Jr. et al. | 340/347 DD |
| 4,584,684 | 4/1986 | Nagasawa et al. | 371/33 |

OTHER PUBLICATIONS

Proceedings of the I.R.E.; "A Method for the Construction of Minimum Redundancy Codes," Huffman, David A. PP1098-1101, Sep. 1952.

Primary Examiner—Benedict V. Safourek
Attorney, Agent, or Firm—Flehr, Hohbach, Test, Albritton & Herbert

[57] ABSTRACT

A data compression system for increasing the speed of data transmission system over a communication channel with a predefined data transmission rate. The system has two data compression units—one on each end of the channel, coupled to first and second data processing systems. Input data from either data processing system is encoded using a selected one of a plurality of encoding tables, each of which defines a method of encoding data using codes whose length varies inversely with the frequency of units of data in a predefined set of data. Whenever an analysis of the encoded data indicates that the data is not being efficiently compressed, the system invokes a table changer for selecting from among the encoding tables the one which minimizes the bit length of the encoded data for a preselected sample of the input data. If a new table is selected, a table change code which corresponds to the selected table is added to the encoded data. Also, a dynamic table builder builds a new encoding table to be including in the set of available encoding tables using a preselected portion of the previously encoded input data which an analysis of the encoded data indicates that a new encoding table will enhance compression. Each data compression unit includes a data decoder for decoding encoded data sent over the channel by the other unit. Thus the data decoder uses a set of decoding tables corresponding to the encoding tables, means for selecting a new table when a table change code is received, and means for building a new decoding table when it receives a table change code which indicates that the encoded data following the table change code was encoded using a new encoding table.

17 Claims, 23 Drawing Figures

Adaptive Data Compression System

*Alternate Representation of Decoder Table*

One Encoder Table

One Decoder Table

FIGURE 5  Table Building

*String Substitution*

Adaptive Data Compression System

*Host Input Buffer*

FIGURE 12    Main Program

ADAPTIVE DATA COMPRESSION SYSTEM

The present invention relates generally to data communication systems and methods, and particularly to data compression systems and methods which improve the efficiency of data transmission.

BACKGROUND OF THE INVENTION

The present invention provides a system and method for increasing the speed of data transmission by compressing the data before transmission and decompressing it after it is received. The present invention "preserves information"—i.e., the receiver gets exactly what was transmitted, and thus the compression does not cause information to be lost.

Standard data representations such as ASCII and EBCDIC are designed for flexibility rather than efficiency. It is well known that for any specific application, a more efficient encoding of data is possible.

The basis of data compression is the fact that for any specific purpose, general-purpose codes provide a coding which is more lengthy than needed. Simple viewed on a character basis, standard English proses uses 26 lower case symbols, 26 upper case symbols, 10 numeric digits, and perhaps 18 punctuation symbols—a total of 80 symbols. ASCII and EBCDIC both use eight bits per character to provide 256 symbol codes. Furthermore, from a frequency of use viewpoint, 20 lower case, 8 upper case, and 4 punctuation symbols comprise over 90 percent of typical usage.

The variable-bit-length Huffman code technique, described in some detail below, provides a specific mechanism to exploit this variability in frequency of use. For standard English prose, this provides an average code size of slightly more than five bits per character (this estimate is based on the frequency tables in "Cypher Systems", by Beker and Piper, 1982).

The prior art includes a variety of data compression techniques. For instance, see Huffman, A Method for the Construction of Minimum-Redundancy Codes, Proceedings of the I.R.E., p.1098 (September 1952)

U.S. Pat. No. 3,237,170 (Blasbalg et al.),

U.S. Pat. No. 3,694,813 (Loh et al.), and

U.S. Pat. No. 4,494,108 (Langdon, Jr. et al.)

The basic concept behind some data compression schemes, including the present invention, is that data should be encoded using codes that have a bit length inversely proportional to the frequency of the characters or character combinations in the data stream.

The present invention overcomes significant shortcomings in the prior art by providing the following features. First, the prior art does not provide an efficient method of adapting the data compression technique used when the data patterns being encoded change. Most existing schemes for compressing data require special handling by the user and thus require the user to sacrifice both flexibility and ease of use to achieve efficiency. In contrast, the present invention automatically adapts to different data patterns by providing not only a plurality of encoding tables and means for switching from one to another, but also a technique for building new and identical tables in both the encoding and decoding sides of a communication channel without having to transmit the table from the encoder to the decoder.

Second, the prior art does not provide an efficient method of packaging encoded data so that the receiver gets the transmitted data as soon as possible. The present invention provides means for varying the size of the data packets transmitted so that the transmitted data gets to the receiving computer without being significantly delayed by the data compression system.

Third, the present invention, unlike the prior art, uses a string substitution technique in combination with adaptive data compression—a combination which can substantially improve data transmission rates.

Fourth, the present invention, unlike the prior art data, provides protocol emulation features systems which are essential to taking full advantage of the increased data transmission speeds allowed by the data compression.

It is therefore a primary object of the present invention to provide an improved adaptive data compression system and method. The data compression technique of the present invention significantly improves data transmission speed through the use of the features noted above and other features described below.

SUMMARY OF THE INVENTION

In summary, the present invention is a data compression system for increasing the speed of data transmission system over a communication channel with a predefined data transmission rate. The system has two data compression units—one one each end of the channel, coupled to first and second data processing systems. Input data from either data processing system is encoded using a selected one of a plurality of encoding tables, each of which defines a method of encoding data using codes whose length varies inversely with the frequency of units of data in a predefined set of data. Whenever an analysis of the encoded data indicates that the data is not being efficiently compressed, the system invokes a table changer for selecting from among the encoding tables the one which minimizes the bit length of the encoded data for a preselected sample of the input data. If a new table is selected, a table change code which corresponds to the selected table is added to the encoded data. Also, a dynamic table builder builds a new encoding table to be including in the set of available encoding tables using a preselected portion of the previously encoded input data which an analysis of the encoded data indicates that a new encoding table will produce enhanced compression.

Each data compression unit includes a data decoder for decoding encoded data sent over the channel by the other unit. Thus the data decoder uses a set of decoding tables corresponding to the encoding tables, means for selecting a new table when a table change code is received, and means for building a new decoding table when it receives a table change code which indicates that the encoded data following the table change code was encoded using a new encoding table.

Other features of the present invention include the use of a string substitution technique for further compressing data when repeated strings are present in the data; protocol emulation to facilitate the simultaneous transmission of newly encoded data while the receiving computer is still reading previously transmitted data; and varying the size of the data packets transmitted to minimize the amount of time it takes the receiving computer to receive the last byte of a message or block of data.

BRIEF DESCRIPTION OF THE DRAWINGS

Additional objects and features of the invention will be more readily apparent from the following detailed description and appended claims when taken in conjunction with the drawings, in which:

FIG. 3 depicts one set of bigram encoding tables, while

DESCRIPTION OF THE PREFERRED EMBODIMENT

Figure 1:
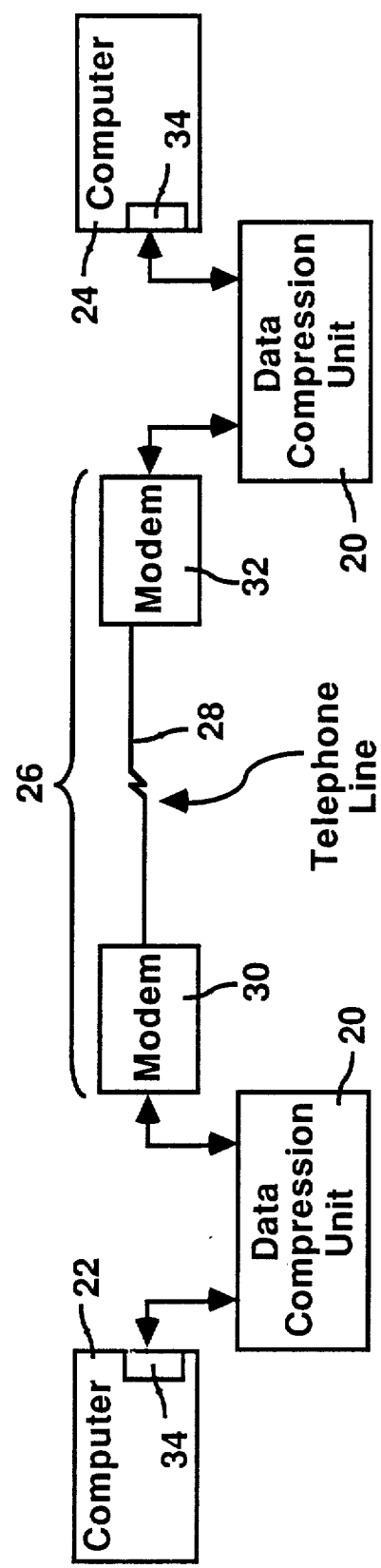
FIG. 1 is a block diagram of two computers transmitting data to one another over a communication channel.

Referring to FIG. 1, the preferred embodiment of the present invention is a data compression system using two identical data compression units 20 to couple two data processing systems 22 and 24 to a communication channel 26. The purpose of the compression units 20 is to increase the effective speed of data transmission between the two computers 22 and 24. In typical applications of the preferred embodiment, the speed of data transmission is increased by a factor of 2.5 to 3.0.

By increasing the speed of transmission between two computers, the cost of using the communication channel is reduced, and the computers are also used more efficiently.

Each data compression unit 20 performs both encoding and decoding functions. In the preferred embodiment, data can be transmitted simultaneously in both directions over the channel 26, with each data compression unit 20 simultaneously performing both encoding (compression) and decoding (decompression) functions.

In the preferred embodiment, each data compression unit 20 is a preprogrammed one board microcomputer with data ports for communicating with a computer 22 and a modem. The microcomputer also includes ports for a standard keyboard and display device so that the user of the unit 20 can specify the unit's operating parameters (e.g., the type of computer to which it is attached). The microprocessor used in the preferred embodiment is a Z80, made by Zilog, but any microcomputer with similar computational speed and input/output handling capabilities could be used.

OVERVIEW OF DATA TRANSMISSION

Speed Increasing Techniques

Data Compression. In the present invention, data transmission speed is increased primarily by "data compression", i.e., reducing the number of binary bits transmitted while still preserving all of the information being transmitted.

However, as will be described in more detail below, the present invention also increases data transmission speed by a combination of several other techniques.

Packet Sizing. The essence of packet sizing is to break up the data being transmitted, especially at the end of a "message" or "file", so that the receiving computer is kept busy reading decompressed data while the remaining encoded data is transmitted over the relatively slow communication channel between the two computers.

Protocol Exultation. Another speed increasing technique used by the present invention is called "protocol emulation". In many computer systems, when the computer transmits data over a communication channel it will transmit only one message or block of data until it receives an acknowledgement that the message or block has been successfully received. The purpose of such a protocol is to allow the transmitting computer to retransmit the message if it was lost or corrupted during the transmission process. Unfortunately, if the transmission time over the channel is long, the acknowledgement signal transmission can significantly slow down the process of transmitting data from one computer system to another.

The concept here is to eliminate the acknowledgment cycle delay by sending the transmitting computer an acknowledgment immediately, rather than waiting for the receiving computer to send an acknowledgment. This frees the transmitting computer to continue sending more data. It also allows data to be transmitted over the channel virtually continuously, rather than in spurts separated by acknowledgment cycles.

To make protocol emulation work, the compression unit 20 must store the transmitted data until the compression unit on the other end of the channel confirms that the transmitted data was successfully received. If the data was not successfully received, the two compression units resynchronize themselves and the data is retransmitted until it is received error free.

Data Channel

Referring to FIG. 1, in the preferred embodiment, the communication channel 26 is a standard telephone line 28 terminated by standard modems 30 and 32 at either end.

Data channels 26 have several characteristics which are important to the invention. First of all, data is transmitted over the channel at a specified or predetermined transmission rate, such as 1200 baud. Second, data channels are not perfect and can introduce errors in the transmitted data. Third, data channels are generally used to transmit data in both directions. In fact, many systems require the receiving system to send acknowledgement data back to the transmitting system so that the transmitting system knows that it is okay to send more data.

Computers generally communicate with the outside world through data ports 34. Typically, such communications are controlled by a device called a UART (universal asynchronous receiver transmitter). Much like the data channel 26, such data ports 34 are characterized by a data rate—i.e., the rate at which the computer can transmit and read data. In most cases, the computer's data rate exceeds the channel transmission rate. For instance, many computers have data rates of 9600 baud to 19200 baud, while few data channels can transmit data faster than 2400 baud.

Data Buffering and Simultaneous Processing. In prior art communication systems, the difference between the data rate of the computer's data port 34 and the telephone channel 26 is a significant hindrance to smooth and efficient data transmission. The present invention uses a combination of packet sizing and data buffering to keep data flowing smoothly and efficiently between the two computers 22 and 24.

The primary purpose of data buffering is to allow certain functions to be performed simultaneously, and to thereby increase the system's efficiency and the speed of data transmission. For example, the present invention can receive and encode input data from the transmitting computer 22 while transmitting a packet of previously encoded data.

In fact, while each datum must sequentially proceed through each part of the communication system, the present invention allows most of the major data processing aspects of the communication task to be performed "virtually" simultaneously.

As will be understood by those skilled in the art, in a single processor system such as the preferred embodiment of the compressor units 20, tasks are in fact not actually performed simultaneously. However, if the processor in the system can perform each of several tasks which overlap each other in time, and complete each task before it must be done, then these tasks are effectively or virtually performed simultaneously. This is especially important if the extent of the overlap between these tasks is variable.

Data Compression and Bigram Encoding

When data is transmitted, the compression unit coupled to the transmitting computer encodes the input data from the transmitting computer so that the data is represented with fewer binary bits than the input data. In the preferred embodiment, data compression is accomplished primarily by a technique known as "pruned-tree" Huffman encoding using "running" bigrams. Data is represented with codes that have a bit length inversely proportional to the frequency of the character combinations in the data stream.

For convenience, the input data from a computer before it is processed will be called either input data or raw data; the compressed data generated by the invention will be called either compressed data or encoded data; and the decompressed data sent to the receiving computer will be called either decompressed data or decoded data.

Raw data is typically stored in computers with one byte (eight bits) used to represent each character of text data. Even numeric, graphic, pictorial and binary data is generally stored in one or multiple byte memory units. This format is needed for efficient data processing. However, this format is known to include significant amounts of redundant information.

For instance, since the letter "t" is often followed by the letter "h", but is rarely followed by the letter "z" or any of the capital letters, it is inefficient to encode an "h" after a "t" with the same number of bits as a "z".

Since the concept of bigram encoding is well known, as is the method of building bigram encryption and decoding tables from a given data sample, these will not be described herein. What will be described is the specific implementation of the bigram encoding technique used in the present invention. This will be sufficient for one skilled in the art of computer programming to practice the present invention.

Figure 2:
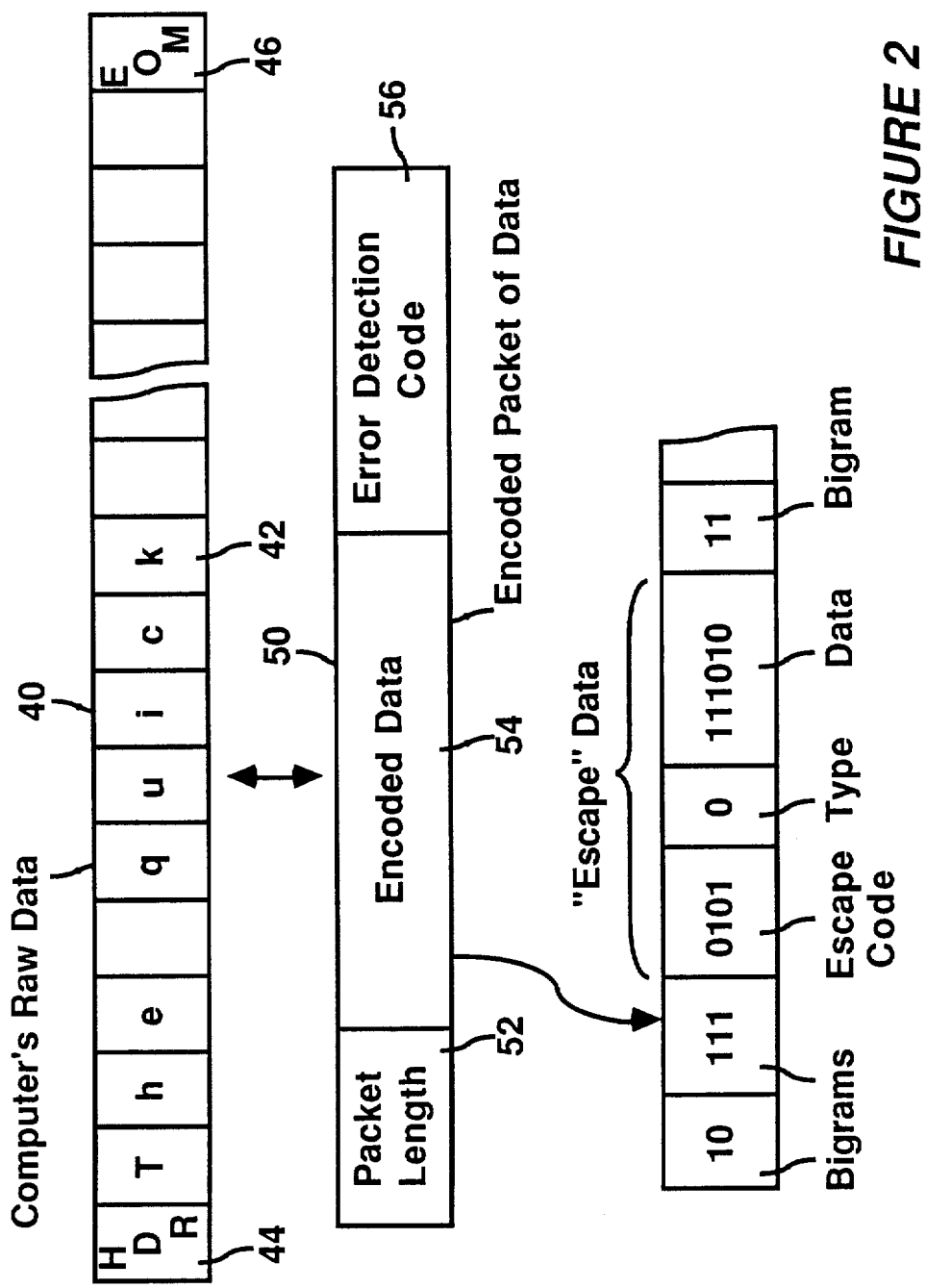
FIG. 2 schematically depicts the difference between raw data and compressed data.

Referring to FIG. 2, raw data 40 sent by a computer 22 to the data compression unit 20 is typically sent in a block or message format which has one byte for each character 42 of text data. The beginning of the data block is typically marked with a header 44, which may indicate the length of the block; the end of the data block is typically marked with an end of message marker 46. In some cases the header and end of message are implied by message timing and are not physically represented.

The compressed data produced by the present invention is packaged in a unit called a packet 50. A packet begins with a length indicator 52, followed by the encoded data 54, and is ended by an error detection code 56. The length indicator 52 is a one byte integer which specifies the number of bytes of data in the packet 50. The error detection code 56 in the preferred embodiment is a cyclic redundancy code known as a "CRC-16" error code—which enables the receiving system to detect whether any of the data in the packet was corrupted during transmission.

Figure 3A:
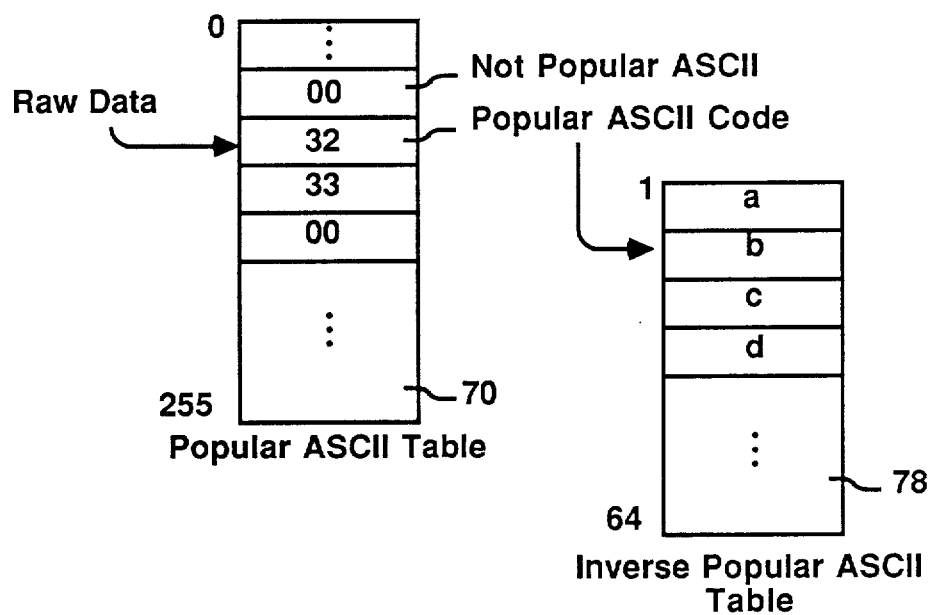
FIG. 3A depicts a table used for encoding characters which are not bigram encoded.
Figure 3:
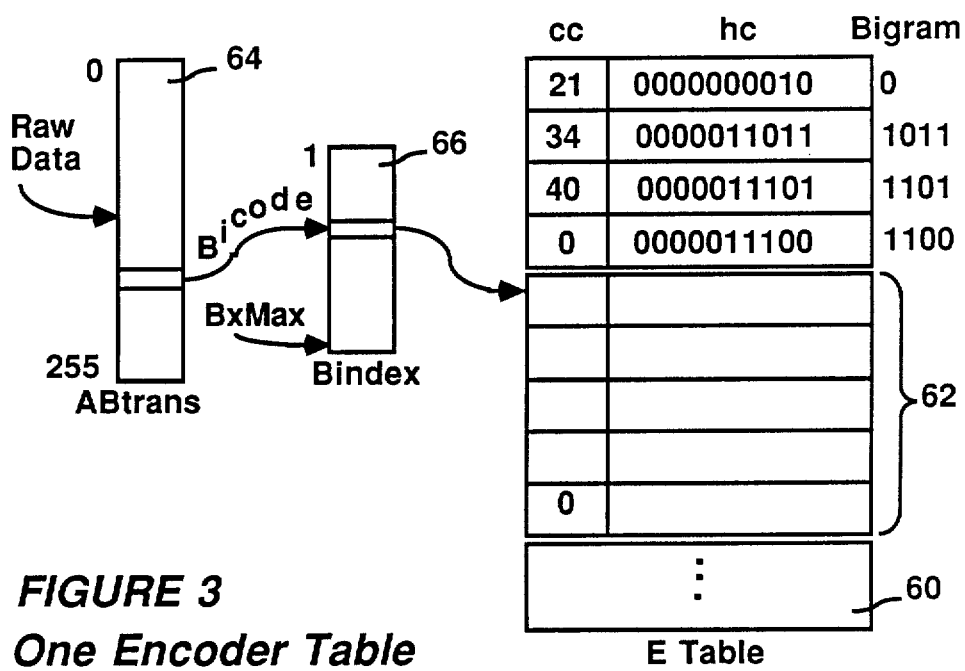

Referring to FIG. 3, raw data is encoded using the "running bigram" technique as follows. A data structure 60, herein called the E Table, includes a bigram table 62 for each of the most common characters (i.e., eight bit symbols) in a preselected data sample. Infrequently used characters do not having a bigram table 62.

Each character of raw data is encoded using the bigram table for the previous input character. Thus, for the input string "the quick", the letter "h" is encoded using the bigram table for letter "t". To find the "t" bigram table, the binary value of the raw character "t" is used as a pointer to look up the bicode for "t" in the ABtrans table 64. If "t" is one of the BxMax (typically sixty) most common characters in the data sample used to build the E Table 60, it will have a nonzero bicode.

The bicode for "t" is then used as a pointer to look up in the Bindex table 66 the address of the "t" bigram table 62.

Finally, the letter "h" is encoded by looking down the "cc" column of the "t" bigram table until the bicode for the letter "h" is found, or until the end of the table is encountered. If the letter "h" is found in cc, the bigram in the "hc" (Huffman code) column is used to represent the "h⇌". As used in the preferred embodiment, the bigram in the hc column comprises all of the bits in the hc entry which are to the right of the first "1" bit in the entry when read from left to right. Since the "hc" column is ten bits wide, the bigram can be anywhere from one to nine bits long.

The encoding therefore proceeds by adding the bits of the bigram for the current character into the current data packet, selecting the bigram table for the current characters, and then repeating the process for the next character. This is called a "running bigram" technique because each character is encoded using the bigram table for the previous character.

Nonbigram codes. There are a number of exceptional cases which require modification of the basic running bigram encoding techique just described. The simplest special case is that the first letter of a message is encoded using the bigram table for the most popular character (the blank space for standard text).

More complicated is the handling of characters which occurs so infrequently that no bicode has been assigned to the character. In most cases, a fairly efficient cutoff results in bicode assignments for all the characters which comprise at least 0.5 percent of the data sample. In any case, if a character doesn't have a bicode, it still needs to be encoded for transmission.

In the preferred embodiment, each bigram table 62 ends with a catch-all "escape" code used for encoding all the characters not in the bigram table. Thus if the current character to be encoded either doesn't have a bicode or isn't in the table 62, then the escape code bigram is added to the current data packet, followed by a code which indicates how the following data is encoded.

Referring to FIG. 3A, the raw binary value of the character to be encoded is used as a pointer into a table called the Popular ASCII Table 70. If the character to be encoded is one of the sixty three most frequently used characters, then its table entry is equal to an integer between 1 and 63 and the character is encoded as a "popular ASCII" character. The code for this is a one bit "0" escape type code, plus a six bit representation of the character's popular ASCII code.

If the character to be encoded is not one of the popular ASCII characters, then it is encoded as an "other ASCII" character. The code for this is a two bit "10" escape type code, plus the eight bits of the character's raw data. Also, characters which follow characters for which there is no bigram table are encoded using the bigram table for the most popular character.

Decoding Compressed Data

Figure 4A:
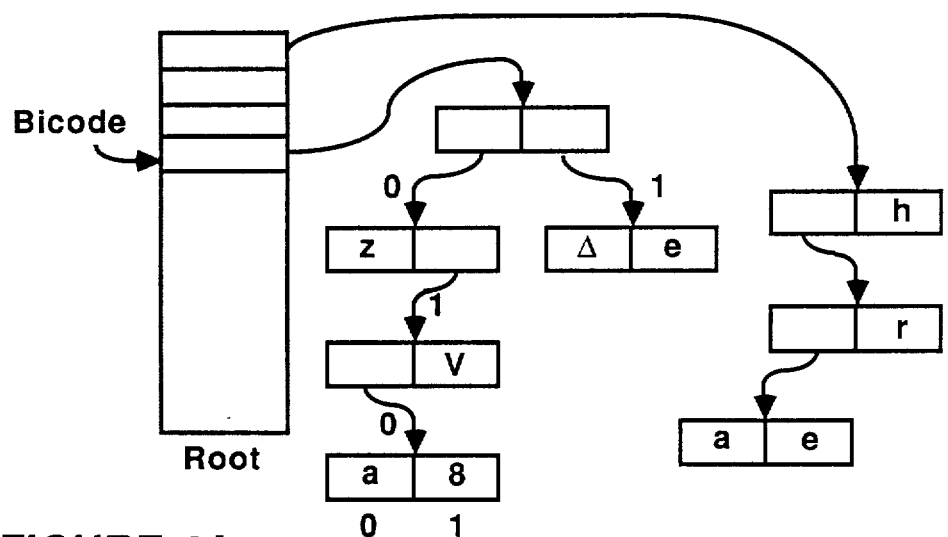
FIG. 4A depicts an equivalent representation of a decoding table.
Figure 4:
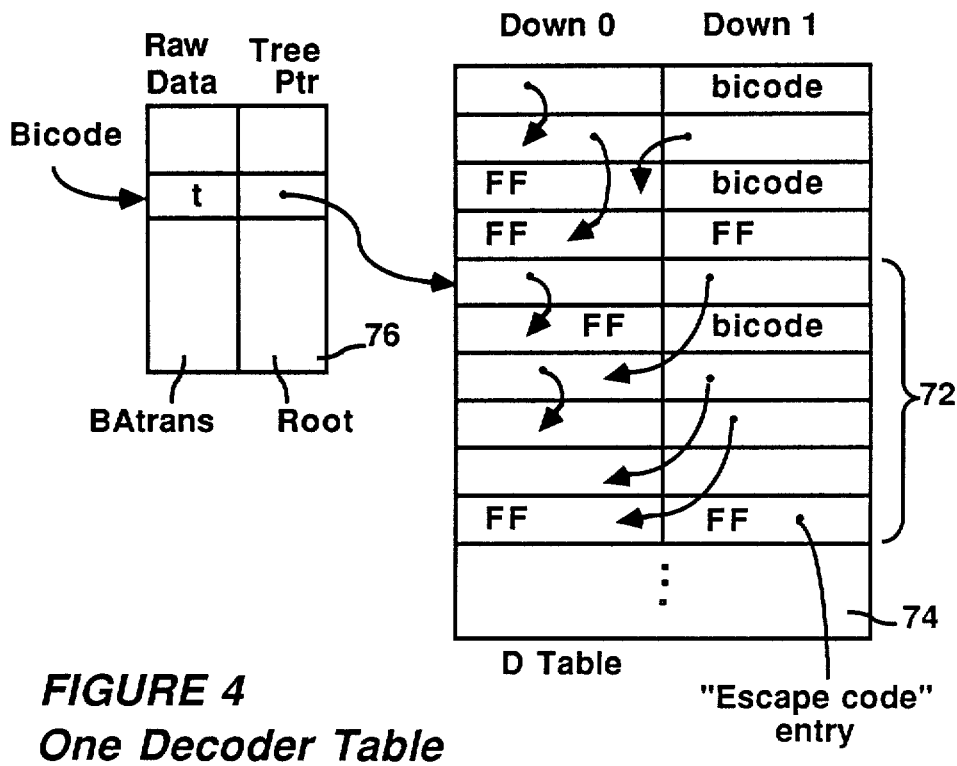
FIG. 4 depicts a one set of bigram decoding tables.

Referring to FIG. 4, the encoded data is decoded or decompressed by the receiving compression unit 20 as follows. All of the data for a packet is accumulated in a buffer called RxBuf. When a complete packet is received its error detection code is checked to make sure that the data received is error free. Assuming that good data has been received the decoding process works as follows. Each character in the current data packet is decoded by using a decoding table 72 selected in accordance with the identity of the previously decoded character. The decoding tables are stored in a data structure called the D Table 74 which has two columns: Down 0, and Down 1. Each datum in the Down 0 and Down 1 columns is a pointer to another row of the decoding table, unless the Down 0 entry is equal to $FF_{16}$ or $255_{10}$. In that case, the Down 1 entry for that row is equal to the bicode for the character being decoded.

Using computer science terminology, once the decoding table has been selected, the decoding works by "walking down the tree represented by the decoding table until a leaf is encountered". In detail, starting at the top of the table, each bit of the encoded data is sequentially processed by following the Down 0 pointer if the current bit being decoded is a 0, and by following the Down 1 point if the bit is a 1. This yields a new "current" D table entry. Then the next bit of the encoded data is processed by following the Down 0 or Down 1 pointer for the current D Table entry. This process continues until the Down 0 value of the current D Table entry is equal to FF. The rows with Down 0 entries equal to FF are called leaves. Regardless of whether this took one bit or nine, the result is a single bicode from the Down 1 entry of the leaf found by the tree traversal.

An alternate representation of a decoder table is shown in FIG. 4A.

If the bicode from the leaf is equal to FF, this means that the leaf represents an escape code. Otherwise the bicode can be directly translated into a character by using the bicode as a pointer to look up the character's decoded form in the raw data column of the BAtrans data structure 76. Note that the raw data column of BAtrans 76 is the inverse of the ABtrans table 64 used in the encoder.

To decode the next character, the bicode of the previous character is used to find the proper decoder table 72. That is, the bicode of the previously decoded character is used as a pointer to look up the address of the decoding table 72 in the tree pointer column of the BAtrans array 76. As in the encoder, the decoder uses the decoder table 72 for the most popular character if there was no previous character, or if the previous character did not have a bicode.

If the "bicode" found in the decoding table 72 is $FF_{16}$, then the following table is used to decode the bits following the escape code:

TABLE 1

| Bit Value | Escape Type |
|---|---|
| 0 | Popular ASCII |
| 10 | Other ASCII |
| 110 | String Substitution |
| 111 | Table Change |

Thus if the bit following the escape code is a zero, the following six bits are a popular ASCII character code—as described above. Referring to FIG. 3A, the decoded character is found by using these six bits as an index into an inverse popular ASCII table 78 to look up the character's eight bit value. As indicated by its name, the inverse popular ASCII table 78 is simply the inverse of the popular ASCII Table 70 described above.

Similarly, if the bits following the escape code are "10", then the following eight bits are the raw data value of the character being decoded.

The purpose of the "string substitution" and "table change" escape codes will be described below.

The following two sections describe how new bigram tables are built and how repeated strings of three or more characters are encoded using a special "string substitution" code. These sections provide technical background needed for understanding how the present invention works, as described in the sections following hereinafter.

Using Multiple Bigram Tables and Building New Bigram Tables

It is a fact that different types of data, and even different subsets of generally similar data, have different statistical distributions of character pairs. For example, the frequency distribution of the characters and character pairs used in a typical computer program will be different from the distribution in a newspaper article. Somewhat more subtle, but still true, is that the statistical distributions for different authors will often be significantly different.

Another fact is that the efficiency (or compression ratio) of the data compression achieved by the running bigram encoding technique depends on the extent to which the data sample used to generate the bigram tables is statistically similar to the data being encoded.

In the present invention, a plurality of E Tables (and corresponding D Tables) are stored in the compression unit's memory so that different tables can be used for different types of data. The preferred embodiment provides five such tables, including four which are predefined: one for "regular English text", one for computer programs written in the language C, one for computerized spread sheets, one for computer programs written in Z80 assembler language.

The fifth E Table (and D Table) in the preferred embodiment is one which is built using the data being transmitted.

When data transmission begins, the data compression unit selects one of the E Tables (the regular English table) to encode the transmitted data. Periodically, the compression unit checks the suitability of the currently selected E Table by looking at the system's current compression ratio.

The term "compression ratio" is defind herein to mean the ratio of the number of bits in the raw data to the number of bits in the encoded data.

The inventor has found that if the compression ratio is less than 2:1, a better E Table can usually be used to encode the data being transmitted. In such a case, the system checks all the other E Tables in the system to see if using any of these would result in a better compression ratio. If so, the compression unit switches tables. To do this, the compression unit puts a "table change" escape code into the current data packet. This table change escape code looks like this:

escape code/table change code/table number/p/c where the table change code is 111, the table number is a three bit binary number which indicates which new table is to be used, the "p" is a two bit indicator of the type of parity used by the input data (i.e., even, odd, one or zero parity), and the "c" is a one bit indicator of whether the input is predominantly upper case characters.

Then all data encoded thereafter uses the newly selected table.

In the present invention, if the compression ratio continues to be poor for a while, the compression system attempts to build a better E Table to be used for encoding all future input data. Since table building is a time consuming process, the criteria for determining when to build a new table are designed to ignore minor fluctuations in the compression ratio and to respond only to longer trends or changes in the statistical distribution of characters in the input data. The exact criteria for deciding when to build a new table are described below. Also, the word "attempt" is used above because it may be that the input data is so random that no E Table will significantly compress this data.

Figure 5:
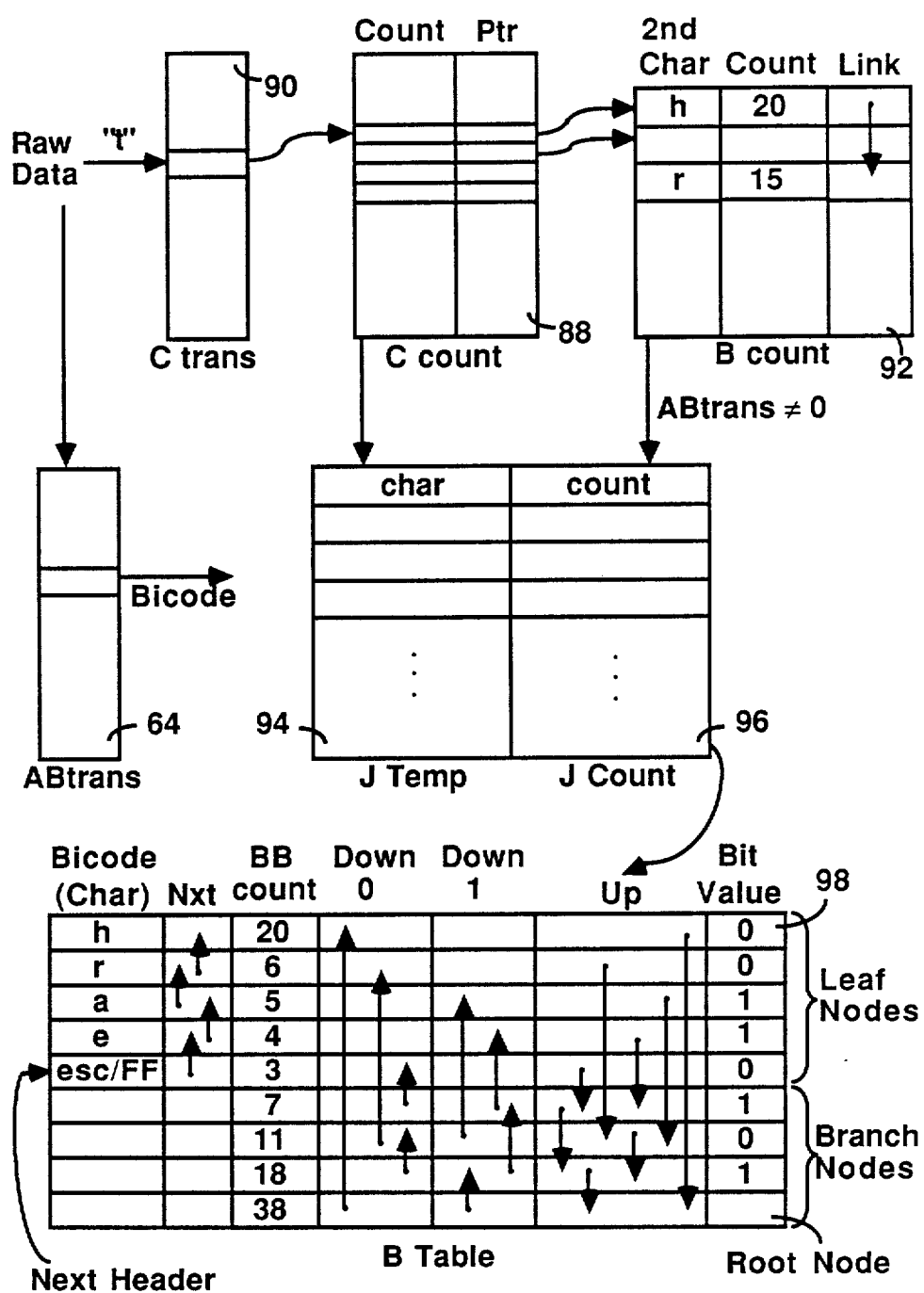
FIG. 5 depicts the data structures used in the process of building a new set of bigram encoding or decoding tables.

Referring to FIG. 5, a new decoding or encoding table is built as follows. First of all, a sample of data must be selected as the basis for generating the table. In the preferred embodiment, the contents of a "history buffer" which contains the last 1024 characters of input data which were previously encoded is used for table building.

Second, statistics are compiled on the frequency of use of each (single byte) character in the data sample, and also on the frequency of use of each two character combination. An array called CCount 88 is used to store the number of occurrences of each character, and an array called Ctrans 90 is used to map the binary value of the character into a specific row of the CCount array 88.

The row entry in the CCount array 88 for a selected character contains a count value (in the count column) and a pointer (in the pointer column) to a linked list of frequency counts for each two character combination in the data sample which begins with the selected character. This list is stored in an array called BCount 92. Each row of BCount contains three values: the second character of a two character combination found in the data sample, the number of times that combination occurred in the data sample, and a link pointer to the next BCount row for other two character combinations with the same first character. The end of each linked list in the BCount array is indicated by a zero link entry.

Using the example shown in FIG. 5, the Ctrans array 90 can be used to find the CCount row for the letter "t". This row's count value is the number of times the letter "t" was found in the data sample. This row's pointer points to a list of two character combination count values in the BCount array 92. The first two character combination is "th", as indicated by the "h" in the character column. The count value of twenty indicates that the "th" combination occurred twenty times in the data sample. The link pointer points to a row in BCount used for the "tr" combination.

Filling in the Ctrans, CCount and BCount data structures for a given sample is a simple task for one skilled in the art. Basically, the data sample is processed by sequentially processing each character in the data sample and accumulating both single character and two character count values in the proper parts of the data structures. Also, each time a row character or character combination is encountered, new pointers must be put into these data structures so that the entry can be used again later on.

After all the statistics have been accumulated, the CCount array is sorted so that the entries for the characters with the highest count values are at the top of the table. As will be understood by those skilled in the art, this sort can be accomplished in a number of different ways. One result of the sort is that the pointers in the Ctrans table are changed to reflect the new order in the CCount table.

Since each Ctrans entry is basically the row number of the corresponding character's entry in CCount, these Ctrans entries can be used as the bicodes in ABtrans array. One difference, though, is that no more than the BxMax most commonly used characters are assigned bicodes and have bigram tables. In the preferred embodiment, all characters which comprise at least 1.0 percent of the data sample are given a bicode, unless the number of such characters exceeds BxMax (equal to 63 in the preferred embodiment).

The reason for limiting the number of character which are assigned bicodes is to limit the size of certain arrays, and to ensure that all the bicodes can be represented with a specified number of bits (e.g., six bits are used to represent the bicodes in the preferred embodiment).

Next, table building begins. This can be viewed as a two step process which is repeated for each character which has been assigned a bicode. First a B Table 98 is built for the selected character, and then either an encoding or a decoding table is built, depending on whether the compression unit is encoding or decoding data.

To build a B table, the BCount entries for the current character are copied into the JTemp and JCount arrays 94 and 96. However, these entries are copied only if (a) the second character has an assigned bicode, and (b) its count value exceeds a predefined minimum (which is equal to 0.4 percent of the size of the data sample in the preferred embodiment). In detail, this copying operation works by copying, for each qualifying BCount entry in the linked list for the current character, the raw data value for the second character in the character combination into the next available row of JTemp, and the corresponding count value into the same row of JCount 96.

Next, one leaf node is built in the B Table 98 for each entry in JTemp 94. The structure of the B Table 98 is shown in FIG. 5. Each row of the B Table 98 represents a node in a tree data structure. The tree can be visualized as an upside down tree with leaf nodes at the bottom, branch nodes in the middle, and a root node at the top. Also, the selected character for which this B Table is being built (the letter "t" in the above example) is sometimes called the "root" character for the table.

As each leaf node is added to B Table 98, the row used for the node initially contains the following information: the character associated with the row (if the row is a leaf node); a count value called BBCount for the number of data samples associated with this node; and a "next" pointer used to form a linked list of B Table entries in ascending order of BBCount value.

Thus, starting with the largest JCount value, a new row of B Table is allocated by putting the bicode for character stored in JTemp in the bicode/character column of B Table, putting the JCount value in BBCount, and adding the entry to the head of the Next linked list. After the B Table row is allocated, the JCount value for the selected character is set equal to zero and the next largest JCount item is added to B Table.

After all the items in JTemp have been put in B Table 98, an escape code entry (i.e., leaf node) is added to the table. This entry has a "bicode" of $FF_{16}$, a BBCount equal to the number of occurrences of the current "root" character not accounted for already in the B Table, plus one (to account for the tendency of the data to be more random than indicated by the statistics on a relatively small data sample). Then the escape code leaf is added to the appropriate position in the Next linked list—so that the entries are still arranged in ascending order of frequency.

Next, branch nodes are built (in B Table) by repeating the following process until only one item is left in Next list. A branch node is formed by (1) taking the first two nodes in the Next list (i.e., the two nodes with the lowest BBCount values), (2) putting the total of their BBCounts in the BBCount of the current branch node, (3) putting a pointer to one of these two top nodes in the Down 0 slot of the current node and putting a pointer to the other in Down 1, (4) putting pointers to the current node in the Up slot of these two top nodes, (5) putting a "0" in the Bit Value slot of the top node pointed to by the Down 0 pointer for the current node, and putting a "1" in the Bit Value slot of the other top node, (6) deleting these top two nodes from the Next list, and (7) adding the current node to the Next list so that the entries are still arranged in ascending BBCount order.

When the B Table building process is done, the last node created forms the root of the tree used for generating either an encoding or decoding table.

To build an encoding table from the B Table 98, such as the one shown in FIG. 3, an E Table entry is made for each leaf node in the B Table. The bicode for the E Table is obtained from the Bicode column of the B Table. The corresponding Huffman code (hc) is generated by taking the then bit string:

00 0000 0001 and shifting into this string (into the right hand end of the string) the bits from the Bit Value column for each node found by linking up through the Up pointers from the leaf node to the root node of the tree. The resulting ten bit string, which is stored in the "hc" column of the E Table, contains the bigram for the character corresponding to the bicode in the same row of the E Table. The beginning of the bigram marked by the first "1" bit in the "hc" entry.

To build a decoding table, such as the one shown in FIG. 4, the B Table is basically turned upside down: the Down 0 and Down 1 columns of all of the nodes are copied from the B Table into the D Table, in reverse order (i.e., starting with the root node), and for leaf nodes a "stop" value of $FF_{16}$ is put in Down 0 and the bicode value from the bicode column of the B Table is put in Down 1.

As noted above, the table building process is repeated for each character assigned a bicode until a complete E Table or D Table has been built. The resulting E Table should provide the most compressed bigram representation of the sample data which can be made.

Whenever a new table is built by a transmitting data compression unit, it puts a table change code into the encoded data which instructs the receiving data compression unit to build a corresponding new decoding table. This table change code indicates that a new table has been built by using an otherwise illegal table number, such as 7 (whereas the highest table number is five).

The receiving data compression unit builds a corresponding decoder table by maintaining a history buffer identical to the transmitting system's History Buffer 100, and using the contents of its History Buffer to build a new decoder table whenever a "build new table" table change code is decoded during the data decoding process.

History Buffer and String Substitution

Figure 6:
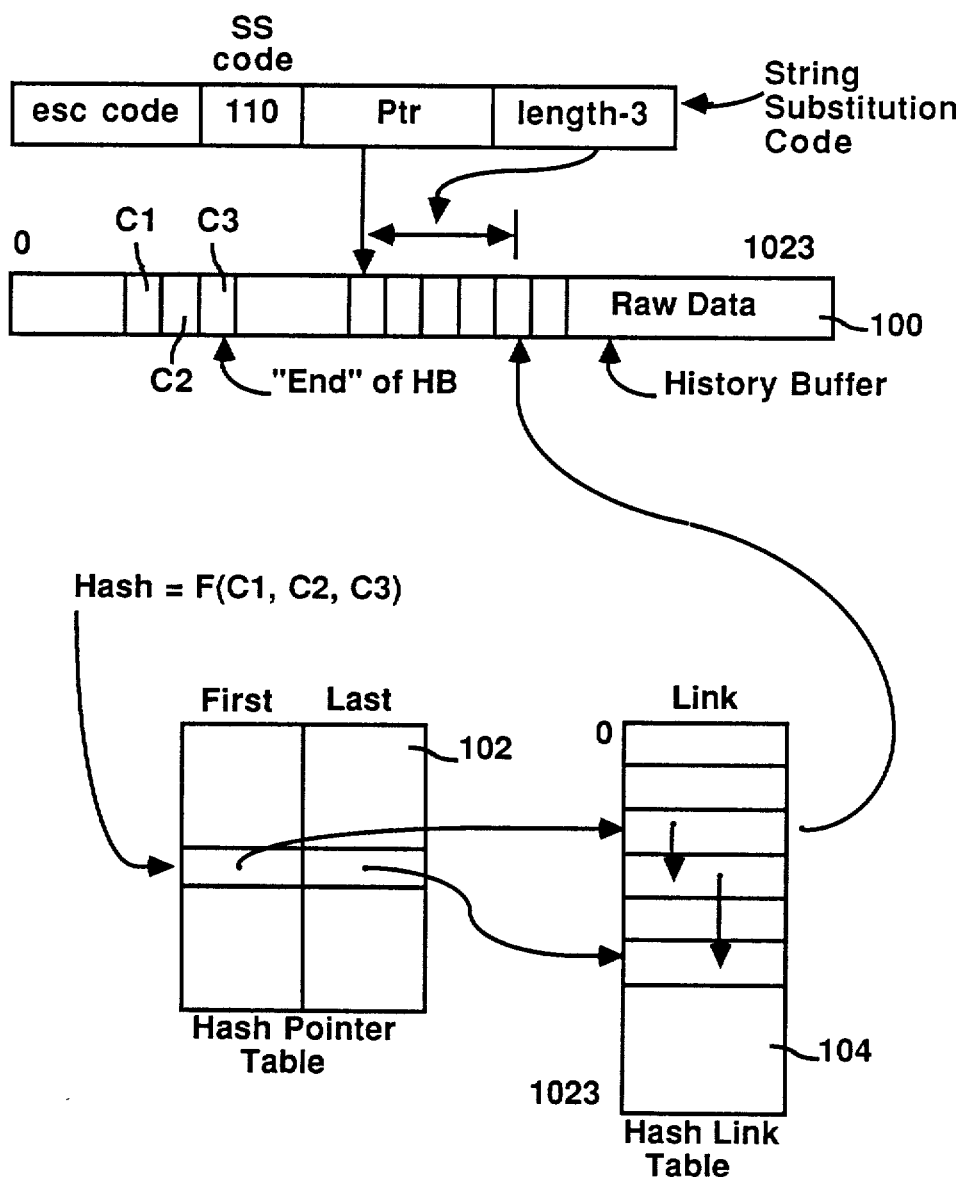
FIG. 6 schematically depicts data structures used in the process of maintaining a history buffer and using it for generating string substitution codes.

Referring to FIG. 6, the last 1024 characters of input data which have already been encoded are stored in a circular buffer 100 called the History Buffer. When new input data is encoded, the present invention checks to see if a "string" of at least three characters in this new input data matches a string in the history buffer. If so, this string of input data is encoded or represented by a "string substitution" code rather than using the bigram encoding technique described above.

The system checks to see if the bit length of the string substitution code is shorter than the bit length of the data using regular bigram encoding. Thus the system always chooses the most efficient encoding method.

The following is a description of how the history buffer works and how matching strings are located for string substitution.

In particular, a hash table is used to quickly find specified strings in the history buffer 100. This hash table is made up of two data structures: a hash pointer table 102 and a hash link table 104.

For each three character string C1,C2,C3 in the history buffer 100, a hash value is assigned using the formula $$Hash = F(C1,C2,C3) = (16 \cdot C1 + 4 \cdot C2 + C3)/256.$$

This hash value is used as the address of a row in the hash pointer table 102. This row in the hash pointer table has First and Last pointers to a linked list in the Hash Link Table 104, which is a list of all the three character strings in the history buffer 100 with this same hash value. In particular, each entry in the Hash Link Table 104 contains a Link to the next entry in the list, if any. The location of each has link entry in the hash pointer table 102 corresponds to the position in the history buffer of the first character C1 for that entry. Thus hash link entry 871 corresponds to character 871 in the history buffer.

The first item in each linked list in the Hash Link Table points to the oldest entry in the History Buffer with the corresponding hash value, and the last item in each linked list points to the most recent entry with this hash value.

As each new character is encoded and committed for transmission (as will described below) the History Buffer 100 is updated by (1) deleting the hash table entry for the three character string starting with the character being replaced in the History Buffer, (2) adding the new character to the "end" of the History Buffer 100, and (3) adding an entry to the hash table for the three character string terminated by the new character being added to the History Buffer 100.

The "end" of the buffer is actually just a location pointed to by an End pointer, which is incremented as data is added until the pointer wraps around to the beginning of the buffer 100.

If at least 1024 characters of data have already been previously put in the history buffer, whenever a new character is added, an old character must be deleted. To do this, the hash code for the three character string starting with the character about to be deleted is calculated. The First item in the hash list for the calculated hash value will be the address in the history buffer of the character about to be deleted. This item is deleted by setting the First pointer for this hash value equal to the second item in this hash list if there is one. If there is no second item, the First and Last entries for this hash value are set to zero.

The three character string ended by the new character being added to the History Buffer 100 is added to the hash table by calculating the hash value of this string and then adding to the end of the hash list for this hash value the hash link corresponding to the History Buffer location of the first character C1 of the string.

When the compression unit 20 attempts to encode input data using string substitution it simply hashes the first three characters of the input data and then searches through the corresponding hash list for the longest string which matches the input data. In the preferred embodiment, if the list is over twenty items long, the search is limited to the first twenty items in the list. Also, the search is terminated if a matching string of at least eighteen characters is found, because the longest matching string which can be encoded as such is eighteen characters long.

Once the longest matching string has been determined, the system counts the number of bits which would be required for bigram encoding this string. If bigram encoding is less than 19 bits (the number of bits required for a string substitution code when the initial escape code is two bits long), bigram encoding is used for the first character in the string; if not, string substitution is used. In an alternate embodiment of the invention, the number of bits required for bigram encoding could be coompared with the actual number of bits required for string substitution.

As shown in FIG. 6, the string substitution code begins with an escape code (found in the currently selected bigram table), followed by the escape type code, 110, for string substitution, followed by a ten bit pointer to the first character of the matching string in the History Buffer 100 and a four bit indicator of the length of the matching string. Since the minimum length of a matching string is three characters, the length indicator in the string substitution code is given a binary value equal to the length of the matching string minus three.

By having the receiving system maintain a history buffer identical in content to the transmitting system's history buffer 100, the receiving system can decode the string substitution code just by copying the portion of its history buffer addressed by the string substitution code. Since the receiving system needs only to decode string substitution codes, it need not have a hash table.

Overview of Data Compression Unit

Now that the techniques of bigram encoding, bigram table building, and character substitution have been explained, the general organization of the data structures and software routines in the preferred embodiment will be explained.

Figure 7:
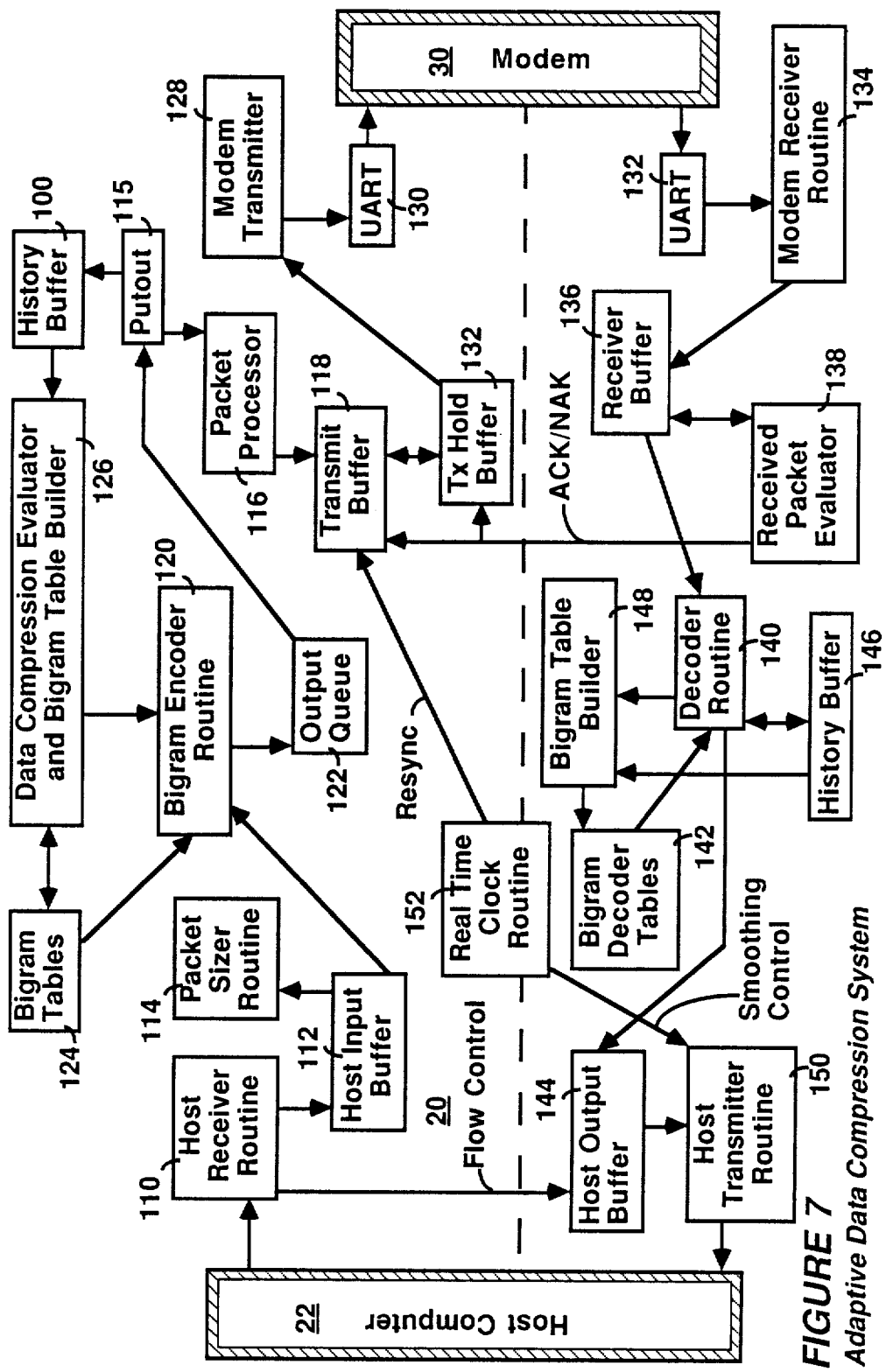
FIG. 7 is a block diagram showing the general organization of the data structures and software routines in the preferred embodiment.

Data Compression Components. Referring to FIG. 7, data transmitted by a host computer 22 is deposited by a Host Receiver Routine 110 into a Host Input Buffer (HIB) 112. Before each character in the HIB is encoded, a Packet Sizer Routing 114 determines if the process of accumulating encoded data into a packet should be terminated. If so, a Packet Processor Routine 116 puts all the previously encoded data into a packet and puts the completed packet in a Transmit Buffer 118.

Each input character in the HIB 112 is encoded by a Bigram Encoder Routine 120, and both the raw data and its bigram are stored in an Output Queue 122. The Bigram Encoder Routine 120 uses Bigram Table 124 to encode the data, as described above. It also uses a Data Compressor Evaluator Routine 126 to determine if the compression unit should lock for a better bigram table than the one it is currently using, and whether a new bigram table should be built based on the contents of the History Buffer 100. Data from the output queue 122 are processed by the string subtitution routine PUTOUT 115 which chooses between bigram and string encoding, and outputs encoded data to the transmit buffer 118.

Completed data packets in the Transmit Buffer 118 are transmitted by a Modem Transmitting Routine 128 through a data port 130 and a modem 30 to another data processing system. Once a data packet has been completely transmitted, it is put in a buffer coded the TxHold Buffer 132 until the data compressor 20 receives acknowledgement that the data packet was successfully received.

Data Decompression Components. Compressed data is received from a Modem 30 through a data port 132 by a Modem Receiver Routine 134 which deposits the compressed data in a Receiver Buffer 136. Once a complete packet has been received, a Receiver Packet Evaluator Routine 138 determines if the packet is free of transmission errors by checking its error detection code. If the packet has good data, this routine 138 causes an acknowledgment "control packet" to be transmitted by the Modem Transmitter Routine 128. Otherwise, a "resync control packet" is sent, which will cause the transmitting system to retransmit the corrupted data packet.

Next a Decoder Routine 140 decodes the data in the Receiver Buffer 136 using Bigram Decoder Tables 142 corresponding to the Bigram Encoder Tables 124 in the transmitting system. As data is decoded, the resulting decoded data is put in both a Host Output Buffer 144 and a History Buffer 146.

If the received data indicates that a new table has been built by the transmitting system, the Decoder Routine 140 calls a Bigram Table Builder Routine 148 to build a corresponding Decoder Table based on the contents of the Histroy Buffer 146—which are identical to the contents of the History Buffer 100 of the transmitting system when it built its new Encoding Table.

Finally, the contents of the Host Output Buffer (HOB) 144 are transmitted to the Host Computer 22 by a Host Transmitter Routine 150.

There is also a Real Time Clock Routine 152, shared by both the data compression and data decompression sides of the compression unit 20. This routine 152, which runs once every 32 milliseconds in the preferred embodiment, checks for timeout conditions which indicate that one or another of the system's input or output activities has ceased activity for at least a predetermined length of time. The usefulness of this routine will be explained in detail below.

Miscellaneous Data Structures

Figure 8:
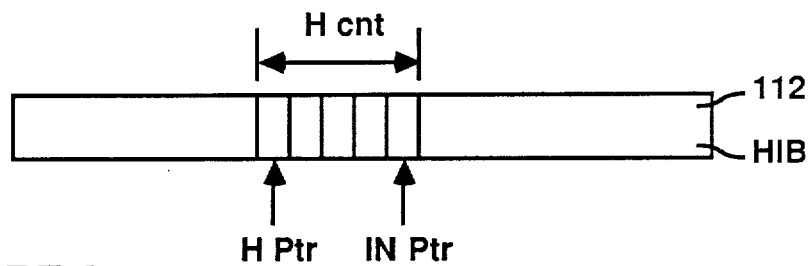
FIG. 8 depicts the Host Input Buffer used in the preferred embodiment.

Host Input Buffer. Referring to FIG. 8, when data is initially received from a host computer 22, it is deposited in a Host Input Buffer (HIB) 112. The HIB 112 is used as a circular buffer, with a pointer called INptr to the slot for the next character received by the data compressor 20, a pointer called Hptr to the oldest character in the buffer which has not yet been encoded, and a counter called HCNT for the number of unprocessed characters in the buffer 112. In the preferred embodiment, the HIB 112 is 1024 bytes long—which allows the host computer to send a sizeable chunk of data to the data compression unit 20 at high speed before the compression unit must cut off the flow of data from the host computer (e.g., by sending and XOFF—stop transmission—signal to the host computer).

Figure 9:
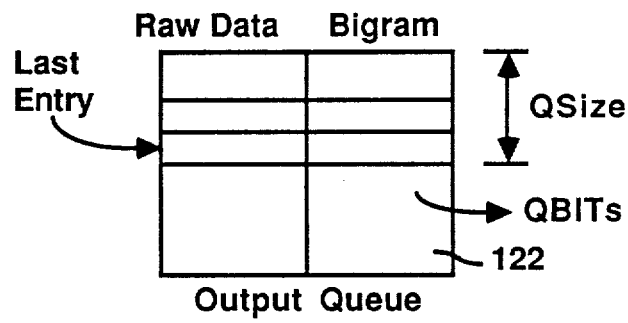
FIG. 9 depicts a the Output Queue used by the data compression portion of the preferred embodiment.

Output Queue. Referring to FIG. 9, each input character in the HIB 112 is encoded by a Bigram Encoder Routine 120, and both the raw data and its bigram are stored in a data structure called the Output Queue 122. New input characters and their bigrams are stored in the Output Queue until they are "committed" for output in a data packet—as will be explained below.

The maximum number of characters stored in the Output Queue 122 at any one time, QSize, is a function of the "target packet size" PMAX—i.e., the maximum number of characters that the system will allow to be put in the data packet currently being formed. Similarly, a number, Qtrigger, related to the data compression ratio, which is used to trigger the building of tables, is also a function of the target packet size PMAX. The following table is used in the preferred embodiment to set the value of QSize and Qtrigger:

TABLE 2

| PMAX | Q Size | Q trigger |
|---|---|---|
| <50 | 18 | 8*18 |
| 50 to 100 | 32 | 7*32 |
| >100 | 64 | 6*64 |

The routines which add and remove data from the Output Queue maintain a running total, called QBITS, of the number of bits in all the bigrams currently stored in the Output Queue 122. When the Queue 122 is "full", i.e., has QSize entries, QBITS is compared to Qtrigger to determine if the bigram tables currently being used to encode the data are performing at an acceptable level.

Figure 10:
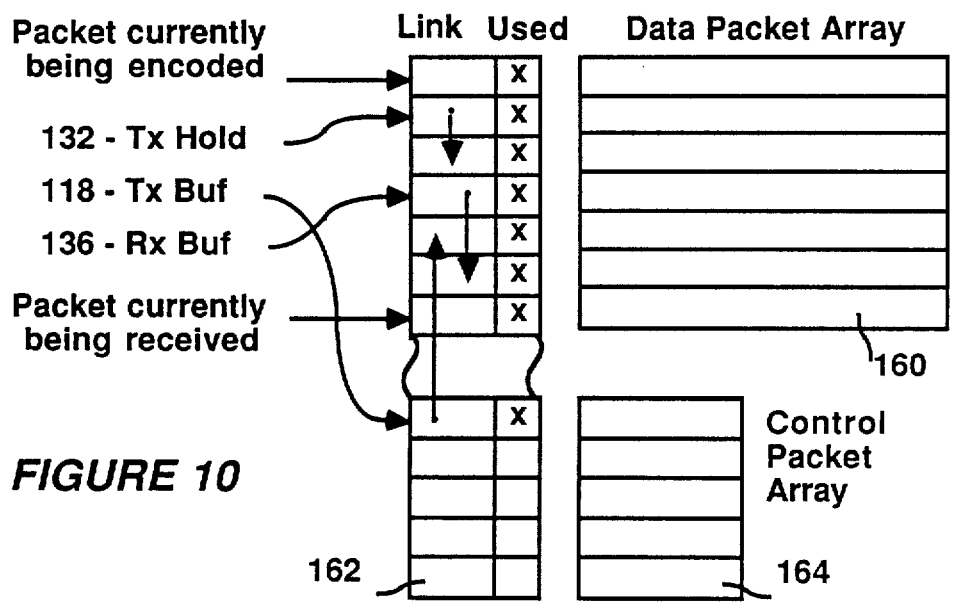
FIG. 10 depicts the data structures used for storing data packets.

Data and Control Packets. Referring to FIG. 10, data packets, regardless of which part of the compression unit 20 is using them, are stored in a data packet array 160. In the preferred embodiment this array can hold seven data packets, each of which can be up to 255 bytes long.

The data packets in the packet array 160 come from different sources and play different roles. To specify the role of each packet, the compression unit 20 uses a set of three linked lists and two pointers for packets in the midst of being formed. The linked lists are formed using a Link array 162, which also includes a "used" designation to facilitate the finding of empty packet slots.

The example shown in FIG. 10 shows all of the slots in the data packet array being used. This will happen only when the data compression unit is both transmitting and sending data and the unit is being given data by its host computer faster than the communication channel can transmit it.

The space in the Data Packet Array 160 is allocated as follows. One slot can be used for storing the packet currently being encoded, and another can be used for storing the data packet currently being received from the communication channel. In addition there is a list 118 called TxBuf of the data packets waiting to be transmitted; a list 132 called TxHold of the data packets already transmitted but which have not yet been acknowledged; and a list 136 called RxBuf of the packets received but not yet decoded.

Also shown in FIG. 10 is a control packet array 164 for storing "control packets". Control packets are small packets of information sent from one compression unit to another to acknowledge receipt of data and to resynchronize the two units when data is lost during transmission. These packets are always four bytes long, and have the following format:

length=0/control information/error detection code.

The packet is identified as a control packet by its having a length counter (i.e., its first byte) equal to zero.

As can be seen in FIG. 10, control packets are linked onto the same linked lists as the data packets.

Overview of How the Data Compression Unit Works

Referring to FIG. 7, the present invention is organized so as to maximize the number of processes which can be performed either simultaneously, or in such an interleaved fashion that the flow of data through the system is generally limited by the transmission capabilities of the communication channel 26.

Several of the routines in the data compression unit 20 are interrupt driven routines. Furthermore, the use of the encoding and decoding routines is interleaved. The combination of these features allows data transmission, receiving, encoding and decoding to all proceed virtually simultaneously.

More specifically, the Host Receiver Routine 110, the Modem Transmitter Routine 128, the Modem Receiver Routine 134, and the Host Output Routine 144 are all interrupt driven. That is, they respond to interrupt signals by (UARTs in) their corresponding data ports.

Another interrupt driven routine is the Real Time Clock Routine 152, which runs once every 32 milliseconds. It is driven by the clock timer output from the UART 130 or 132.

In the "background", the main routine in the data compression unit repeated calls the encoding routines and then the decoding routines to process data flowing through the data compression unit 20.

Another major aspect of the preferred embodiment is the use of variable size data packets, and the use of these data packets as the basic unit of data for most data processing tasks performed by the data compression unit. Thus input data is not transmitted until a full packet is formed, transmitted packets are stored in a hold buffer so that they can be retransmitted if necessary, and so on.

Control Packets. Still another important aspect of how the data compression unit works is how it communicates with the data compression unit on the other side of the communication channel so that two units both know the status of the other. In addition to using control packets to acknowledge receipt of data or request retransmission, control packets can be used to request that the transmitting unit stop transmission (when the receiving unit is receiving more data than it can process, or when the receiving computer has stopped accepting input data for whatever reason) and then restart transmission when the receiving unit is ready for more data. The following is a list of the types of control packets used in the preferred embodiment:

TABLE 3

| Control Packet Type | Description |
| --- | --- |
| ACK | Acknowledges receipt of data packet with specified ID |
| Resync | Data lost or corrupted. The last good data packet received had specified ID. |
| Status | In response to a Resync, this identifies last good packet |

TABLE 3-continued

| Control Packet Type | Description |
| --- | --- |
| | received. |
| Stop | Stop transmission after completing transmission of the data packet currently being transmitted. |
| Restart | Data transmission can restart. |
| Transparent | Switch to transparent mode. |

As indicated in the above table, each data packet has an "ID" associated with it so that the receiving system can tell the transmitting system the ID of the last packet successfully received. In the preferred embodiment, the system never buffers more than two data packets in the TxHold buffer, and therefore only a two bit ID is needed to uniquely identify every data packet. In other embodiments a longer packet ID might be needed.

Transparent Mode. The data compression units 20 are designed so that the computer system need not be physically reconfigured when the other computer it is communication with does not have a data compression unit. When a connection is first established, the data compression unit 20 determines whether there is another data compression unit on the other side of the channel. If not, the data compression unit goes into a mode of operation called "transparent mode" which causes the unit to simply transmit over the communication channel all data sent by the host computer, and to send to the host computer all data received from the communication channel.

Detailed Explanation of Data Compression Method

Figure 11:
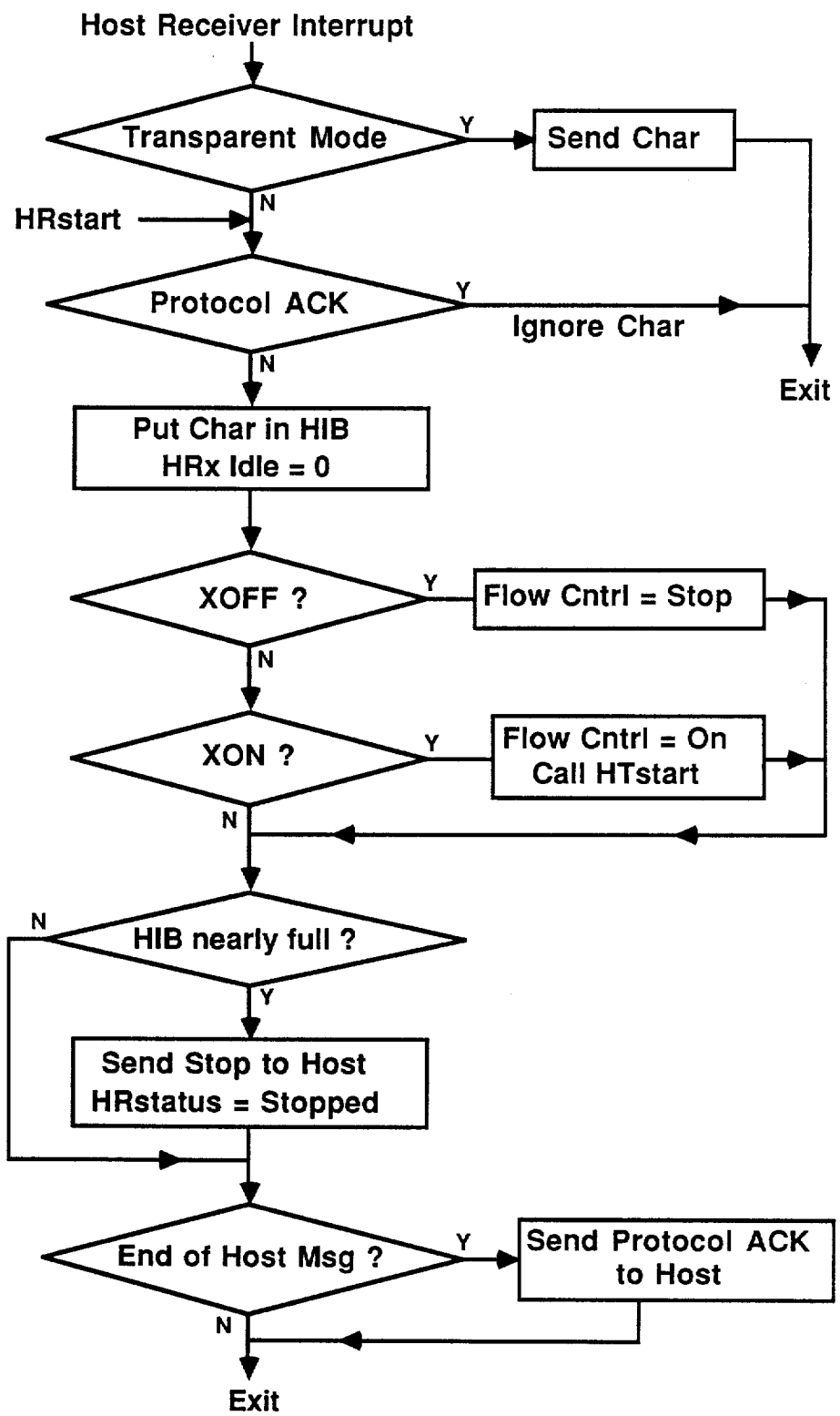
FIG. 11 is a flow chart of Host Receiver Interrupt routine for handling input data from a host computer.

Host Receiver Interrupt and HRSTART. Referring to FIG. 11, if the data compression unit 20 is in transparent mode, all data received from the host 22 is simply given to the modem 30 for transmission. Otherwise input data is processed as follows.

Generally, the Host Receiver Routine is invoked by an interrupt whenever the host indicates that it has a character to send. If the character is an ACK byte for the selected protocol (used to acknowledge receipt of a message or block of data), this byte is simply ignored because the data compression unit 20 has an independent data acknowledgment protocol which supersedes the host's acknowledgment protocol.

If the character from the host is not an ACK, then it is put in the Host Input Buffer and HRxIdle is set to zero. HRxIdle is counter which is incremented by the real time clock routine every 32 milliseconds, and is used to determine how must time has passed since the last byte of data was sent by the host computer 22.

If the character from the host is an XOFF, a flag call FlowCntrl is set equal to STOP so that no further data will be transmitted to the host. If the character from the host is an XON, the FlowCntrl flag is set equal to ON so that data can once again be transmitted to the host, and the HTSTART routine is called to initiate the sending of data to the host computer.

If the Host Input Buffer is full, an XOFF signal is sent to the host computer 22 so that it will stop sending input data to the data compression unit. HRstatus is set equal to STOPPED to that the compression unit knows to restart the data receiving process after some of the data in the Host Input Buffer has been processed.

Finally, if the datum received is the last byte of a message or data block sent by the host, receipt of this unit of data is immediately acknowledged by sending an ACK message to the host. This is done so that the host can continue to send more data to the data compression unit without waiting for the receiving computer to acknowledge receipt of the previous message of block of data.

Figure 12:
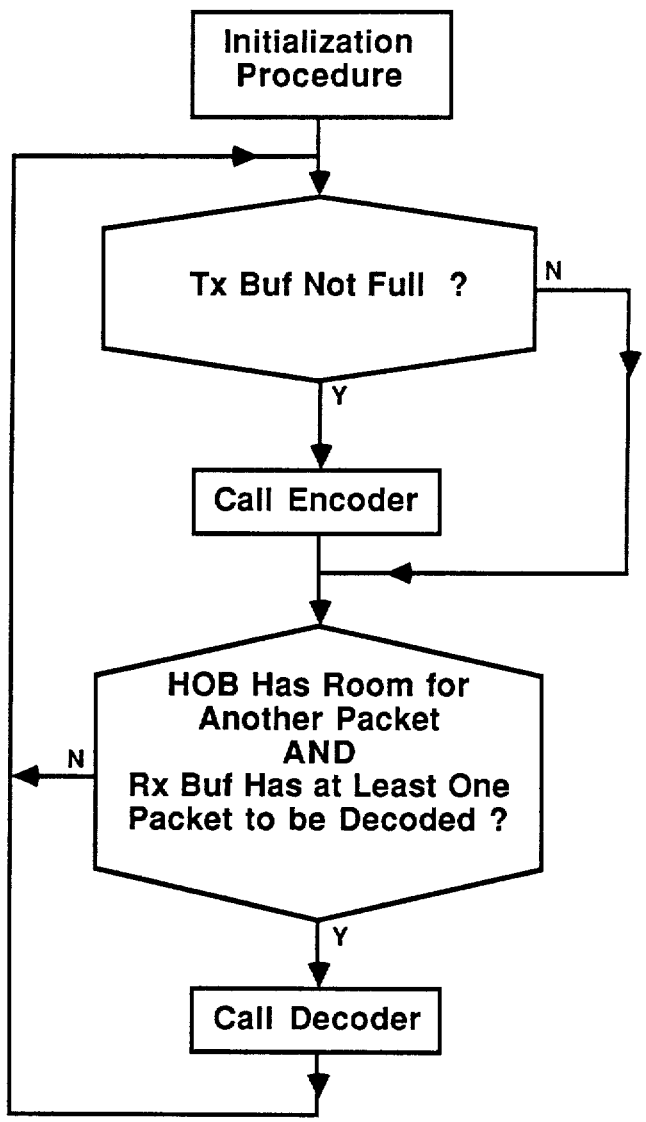
FIG. 12 is a flow chart of Main routine for the preferred embodiment.

Main Program. Referring to FIG. 12, the Main Routine of the data compression unit calls an initializing routine when the unit is first turned on, or is restarted, so that its data structures can be initialized.

Then the Main Program endlessly repeats the process of calling the encoder routines if the TxBuf list is not full, and then calling the decoder routines if the Host Output Buffer has enough room to hold the decoded contents of another packet and the RxBuf list has at least one packet waiting to be decoded.

The TxBuf list is considered to be full if there are already four packets in the TxBuf and TxHold lists (because three packet slots must be kept available for use by the decoder portion of the system).

The Host Output Buffer is a 1024 byte buffer which is considered to have room for another packet if there are at least 720 unused slots in the buffer—which is the maximum number of characters allowed in any packet. The encoder ensures that this limit is never exceeded.

When the decoder routine is called, it follows the procedure described above, with reference to FIGS. 3 through 6, to decode the top data packet in the RxBuf list.

Figure 13:
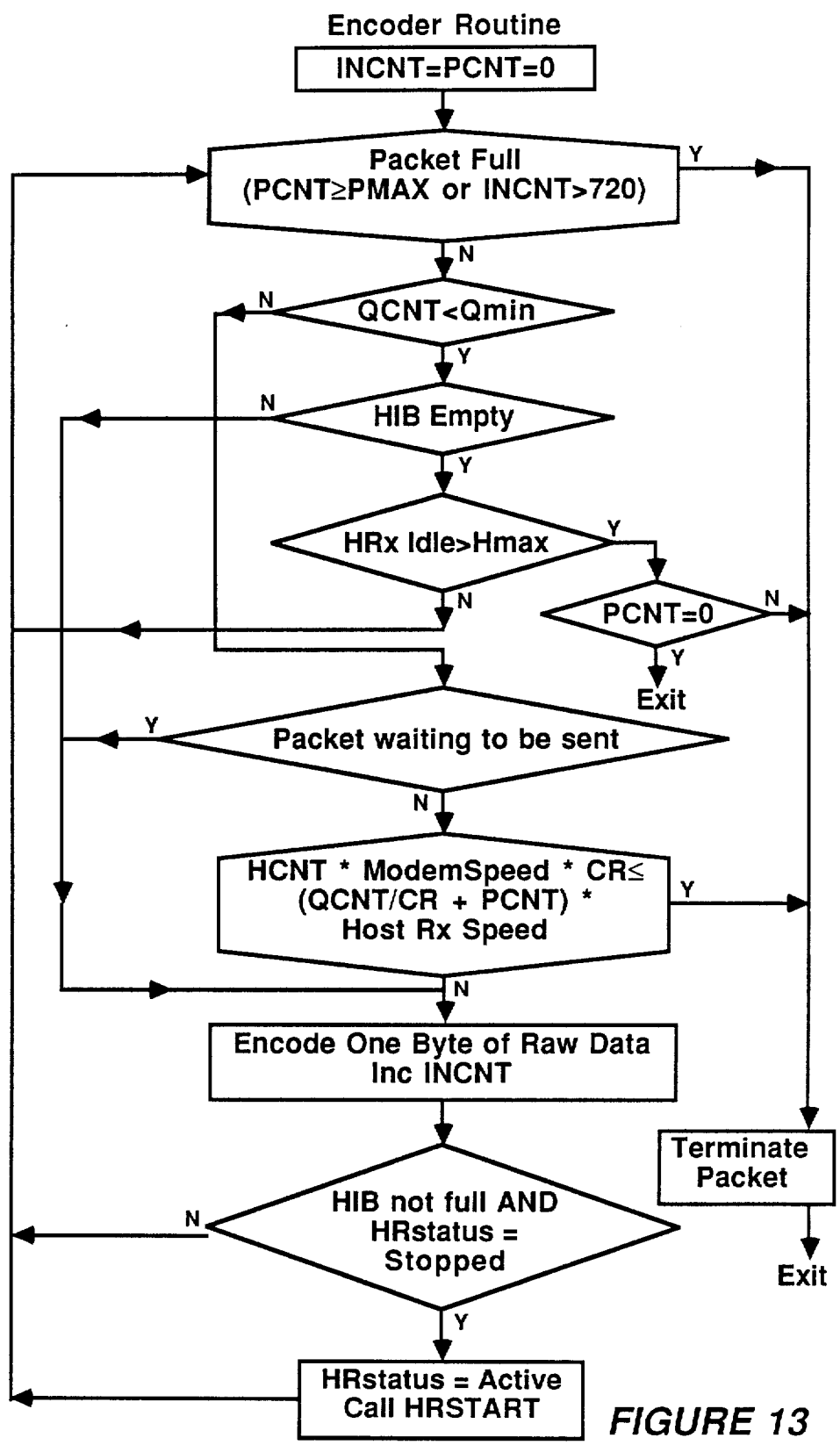
FIG. 13 is a flow chart of Encoder Routine.

Encoder Routine. Referring to FIG. 13, the encoder continues processing input data until is determines that the current packet needs to be terminated. The basic rationale behind this determination is that the receiving computer should be kept busy receiving data as much as possible. Thus, if the receiving computer is idle then a data packet should be sent off as soon as a few (e.g., twelve) bytes of data have been accumulated. To accomplish this goal, the size of the data packets are increased in a geometric series until a predetermined maximum packet size is reached. This causes the process of transmitting data over the relatively slow communication channel to be overlapped as much as possible with the processing of input data.

Similarly, if the host computer stops sending input data to the data compression unit, the goal is to get the receiving computer to read the last byte of data at the earliest possible moment. Thus the end of the input data is not accumulated into one big packet. Rather, some of the input data is transmitted early on so that the receiving computer can read that data while the remaining data is being transmitted. By using packet sizes that geometrically decrease in size, the overlapping of data reading and data transmission is maximized.

The first packet termination test by the encoder routine checks whether the current packet is full. If the number of bytes in the packet, PCNT, is greater than or equal to a preselected maximum, PMAX, or if the number of characters already in the Output Queue and in the packet is 720 (i.e., the maximum number of characters allowed in a packet) then the packet termination routine is called (see FIG. 14).

The second packet termination test is to see if the Output Queue has less than Qmin (e.g., twelve) characters therein, the Host Input Buffer is empty, and no characters have been received from the host computer for a predetermined amount of time (e.g., 4 milliseconds). If all these conditions are met, and there is at least one character already in the current packet, then the packet is terminated so that the receiving computer is not kept waiting for the data in the Output Queue.

If the Output Queue has less than Qmin characters, but the Host Input Buffer is not empty, then the current packet is not terminated and one byte of input data is encoded.

If the Output Queue does have at least Qmin characters and there is either a packet waiting in TxBuf to be transmitted, or new input data has recently been added to the Host Input buffer, then the packet is not terminated and one byte of input data is encoded.

Otherwise, the encoder routine checks to see if terminating the packet would help speed the process of getting the last of the data in the Host Input Buffer into the receiving computer. This test is as follows: if the length of time it will take for said second data processing system to read through its input data port the input data already in the current packet and in the Output Queue is greater than the length of time it will take to transmit over the channel the input data in the Host Input Buffer, then the packet is terminated and the encoder routine exits.

After encoding a byte of data, however, the routine checks to see if the Host Receiving routine is stopped, but the Input Buffer is not full (e.g., has at least 200 empty slots). If so the Host Receiving routine is restarted by calling HRSTART (see FIG. 11). In any case, after encoding a byte of input data the routine cycles back to the beginning of the routine—starting with the test to see if the packet is full.

Figure 14:
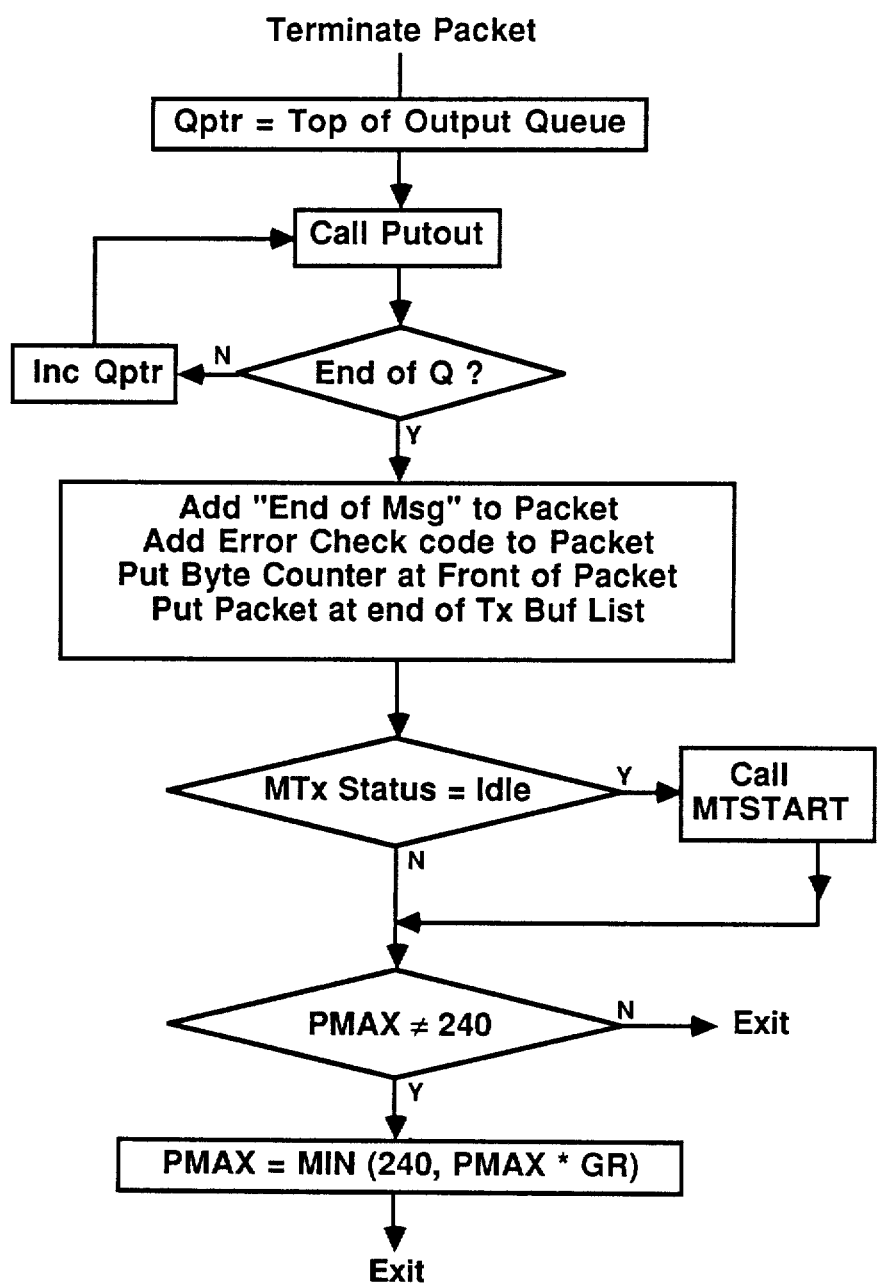
FIG. 14 is a flow chart of the Terminate Packet Routine.

Terminate Packet Routine. Referring to FIG. 14, the procedure for terminating a packet is as follows. First, all of the data remaining in the Output Queue is put in the current data packet by repetitively calling the Putout routine until the Output Queue is empty.

Then an "end of message" marker is added to the end of the data packet. The end of message marker is an escape code followed by an "other ASCII" code for the most frequently occurring character (which has been assigned a bicode of 1).

Next, an error detection code is put on the end of the packet, and a byte counter, which specifies the number of bytes in the packet, is added to the front of the packet. Note that the error detection code is a standard two byte CRC-16 code in the preferred embodiment.

Finally, the packet is added to the end of the TxBuf list (see FIG. 10).

If the Modem Transmitter routine is "idle", the MTSTART routine is called to initiate the process of transmitting the packet just added to TxBuf.

Also, the maximum size of the next data packet is increased by a predetermined "growth ratio", GR, if the packet size is not already at its maximum value. The growth ratio, GR, is equal to the ratio of the receiving computer's input data port reading rate to the rate of data transmission over the channel 26 multiplied by a number (e.g. 2.0 or 2.5) corresponding to an estimate of the compression unit's average data compression ratio:

$$GR = (\text{reading rate})/(\text{channel rate} * \text{compression ratio}).$$

Note that the packet size is capped at a predetermined limit (e.g., 255 bytes) even if increasing the packet size by the growth ratio would otherwise make the packet size bigger than the packet size limit).

Figure 15:
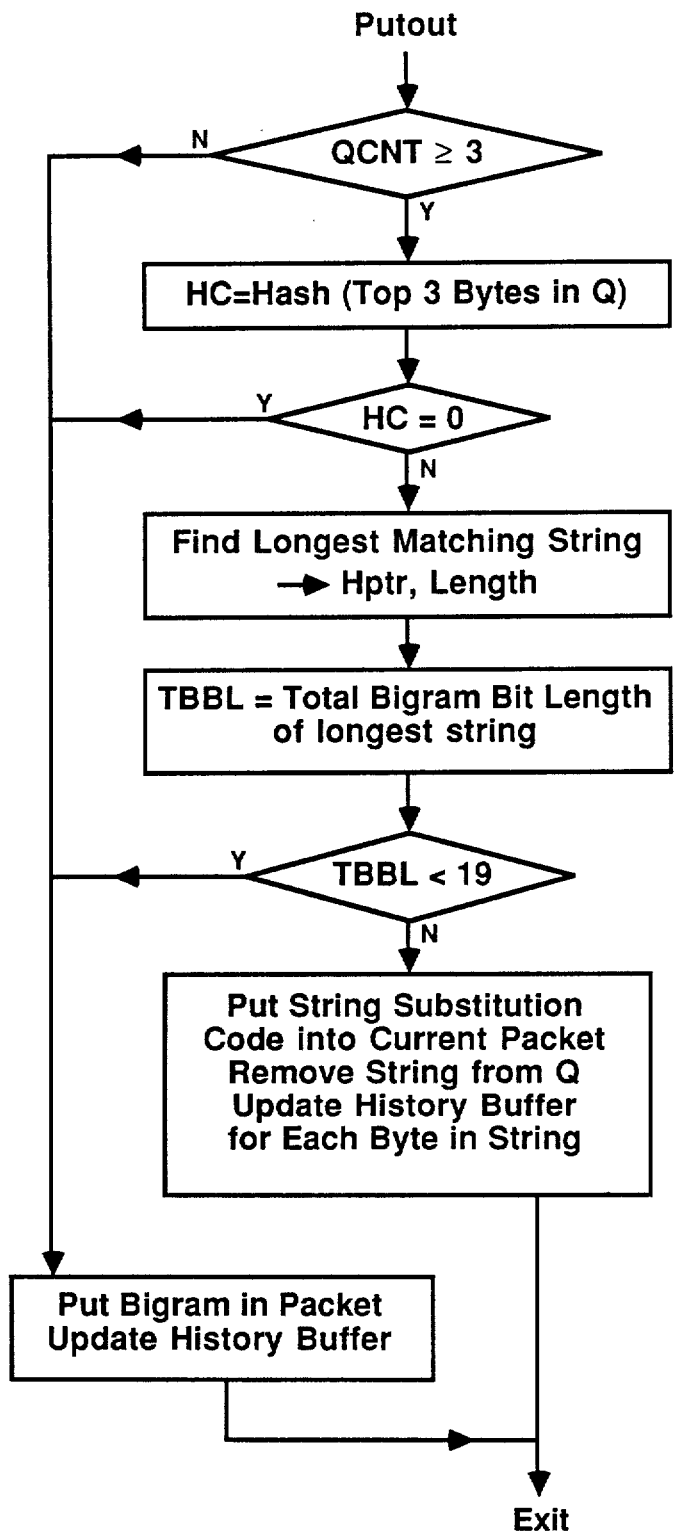
FIG. 15 is a flow chart of the Putout Routine for putting encoded data in the data packet currently being generated.

Putout Routine. Referring to FIG. 15, the Putout routine referred to above is used to move data from the Output Queue into the current packet. If the Output Queue has less than three characters left in it, no string substitution can even been attempted. Therefore the bigram for the top character in the Output Queue is added to the current packet, the character is added to the History Buffer 100 as described above, and the routine exits.

If there are at least three characters in the Output Queue, the Putout routine looks first to see if any strings in the History Buffer match the top three characters in the Output Buffer. If not, the top character in the Output Queue is added to the packet and the History Buffer, and then the routine exits.

If there is at least one matching string in the history buffer, then the routine finds the longest string in the History Buffer which matches the contents of the Output Queue. The length of the string substitution code (actually, an estimate, 19) is compared with the combined length of the bigrams for this string to see which encoding method is more efficient. If bigrams are more efficient, one character is removed from the output queue and its Huffman code is placed in the current packet. If string substitution is more efficient, PUTOUT encodes this matching string with a string substitution code, and puts the code into the data packet. Then the encoded string is removed from the Output Queue, and the History Buffer is updated for each byte in the string.

Figure 16:
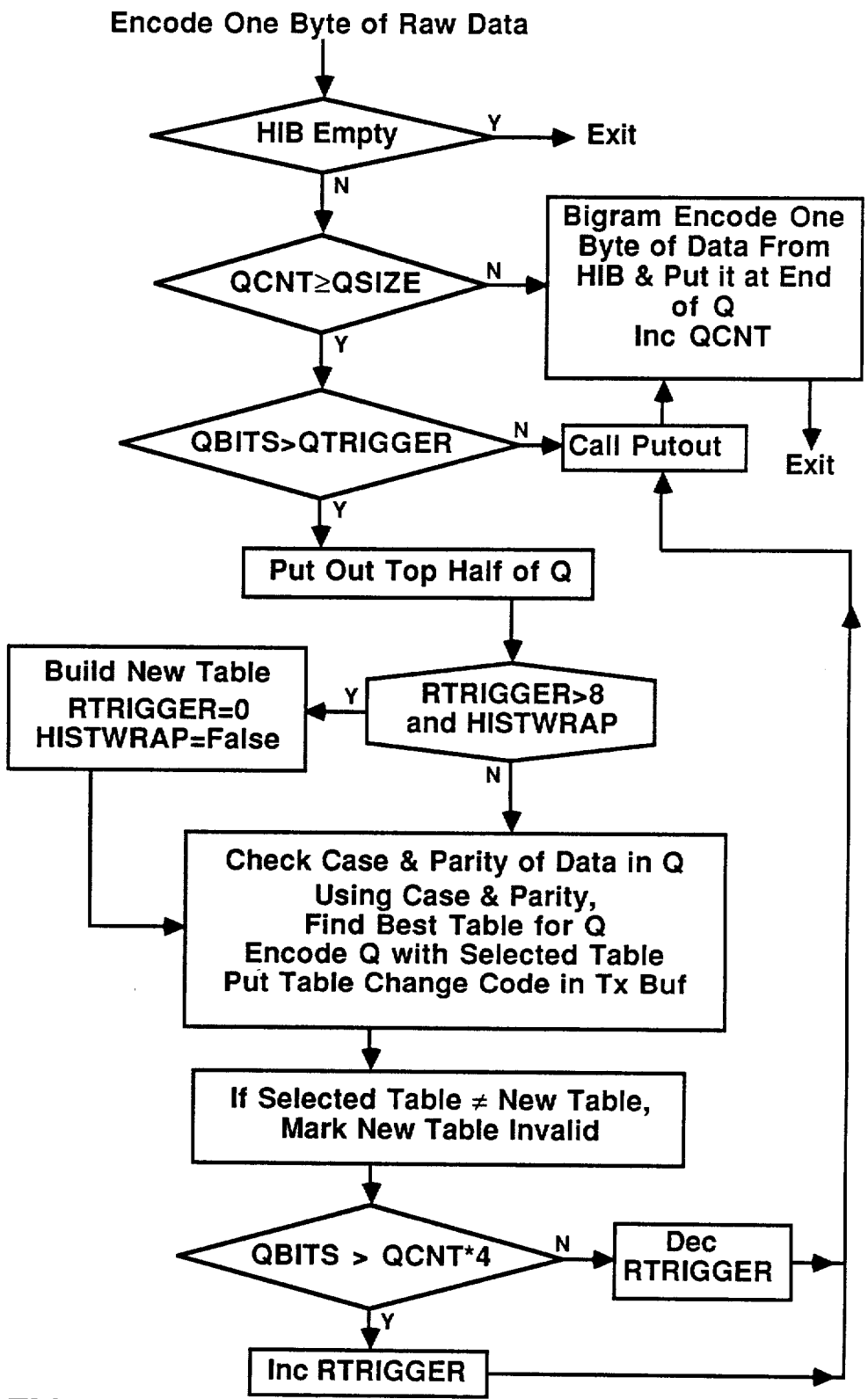
FIG. 16 is a flow chart of the Routine for Encoding One Byte of Raw Data.

Routine for Encoding One Byte of Raw Data. Referring to FIG. 16, the routine for encoding one byte of raw input data is as follows. First, if the Host Input Buffer is empty, the routine simply exits. Also, if the Output Queue is not already full, the oldest entry in the Host Input Buffer is encoded as described above (using either a bigram or an escape code followed by either a popular ASCII code or an Other ASCII code), and the character is added to the Output Queue. Note that, as described above (see Table 2), the definition of how many items it takes to make the Output Queue "full" depends on the current value of the target packet size, PMAX.

If the Output Queue is full, the routine checks to see if the data therein is being efficiently encoded by comparing the total length of the bigrams in the Queue, QBITS, with the Qtrigger value from TABLE 2 above. If QBITS is less than or equal to Qtrigger, the top character in the Output Queue is "committed" by calling the Putout routine, and then a new character is encoded and added to the Output Queue.

If, however, the data in the Output Queue appears to be inefficiently encoded the following procedure is followed. First, the top half of the output queue is put into the current packet by repetitively calling Putout until these characters have been processed. The theory behind this step is that if the nature of the input data changes, this will probably be noticed by the efficiency test around the time when the Output Queue is half full of old data and half full of the new type of input data. Therefore the data which came before the transition should be put in the packet before any further encoding is done.

Next, if the History Buffer has been completely rewritten since the last time that a new set of bigram tables was built (i.e., if HISTWRAP is true), the procedure checks to see if a somewhat more stringent data compression efficiency test has failed at least nine times more than it has been passed since the last time that a new set of bigram tables was built. If so, the routine for building a new set of bigram tables is called, and these new tables become the fifth set of bigram tables available for use by the encoder.

Next, regardless of whether new bigram tables were built, the case and parity of the data in the Output Queue is checked because changes in either of these will immediately cause bigram tables which are based on data with a different case and/or parity to be very inefficient. As will be understood by those skilled in the art, the bicode table for each set of bigram tables can be easily revised or converted to use the detected case and parity. Specifically, the ABtrans and BAtrans tables are modified for the new case and parity.

In any case, using the detected parity and case, the routine reencodes all of the remaining data in the Output Queue using all of the available sets of bigram tables to find the set which most efficiently compresses the data (i.e., produces bigrams with the least number of bits). The data in the Output Queue is then encoded with the selected table and a Table Change code is added to the current data packet. Note that if a new table was built and this is the newly selected table, then a special table number is used in the table change code so that the decoder knows that it has to build a new decoding table.

Also, if a new table was built, but this table is not selected as the best table for encoding the contents of the Output Queue, this new table is marked as invalid so that it cannot be used in the future.

Finally, the RTRIGGER counter is incremented if the compression ratio for the encoded data in the Output Queue is less than two, otherwise RTRIGGER is decremented. Thus RTRIGGER is an indicator or how many times a table change was performed without getting a satisfactory compression ratio—and thus is a measure of how soon the system should attempt to build a new set of bigram tables. Note that RTRIGGER is reset to zero whenever the table building routine is called.

Figure 17:
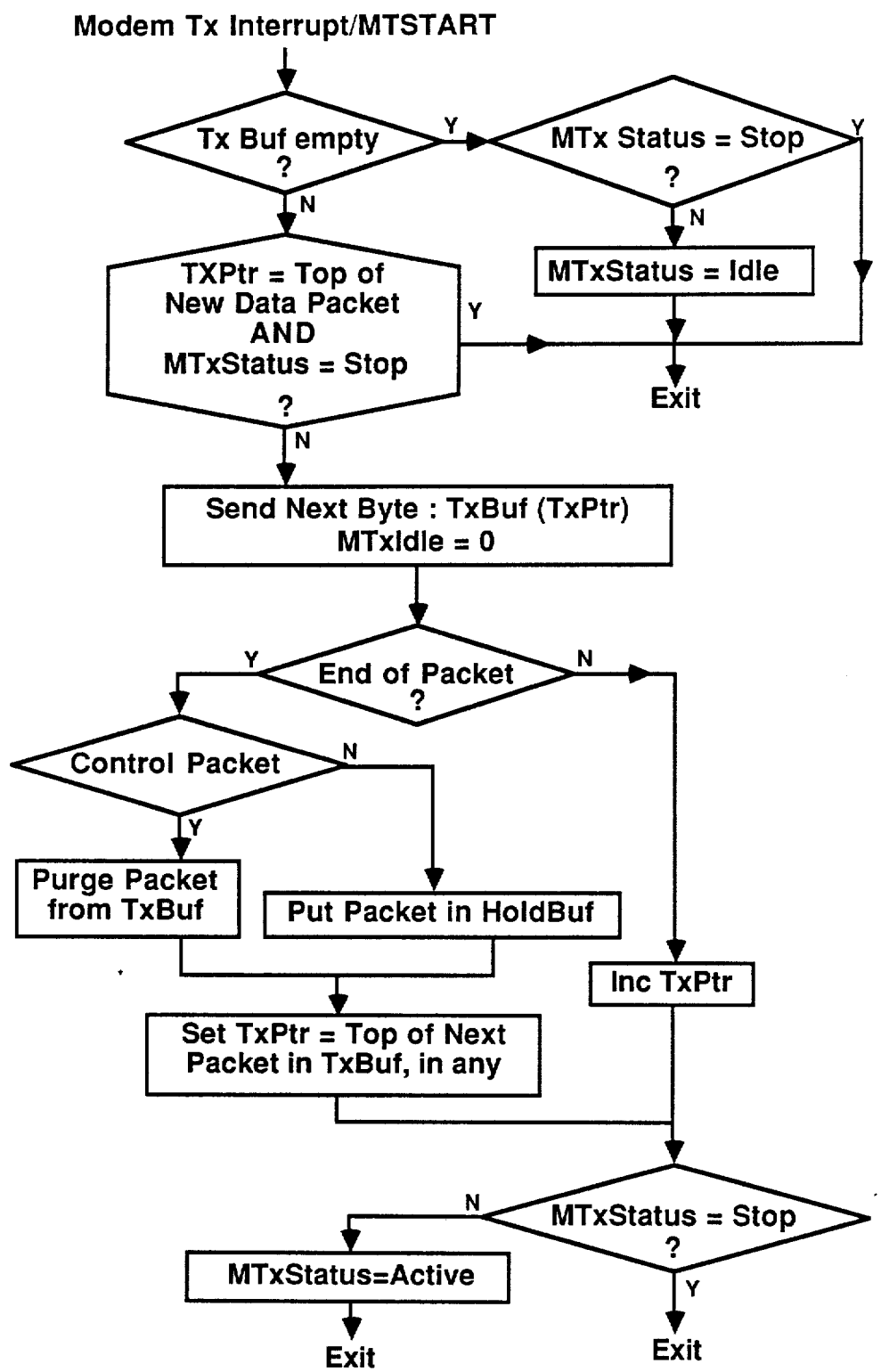
FIG. 17 is a flow chart of the routine for transmitting data over the communication channel coupled to the data compression unit of the present invention.

Modem Tx Interrupt/MTSTART. Referring to FIG. 17, the routine for transmitting data over the channel 26 is normally called by an interrupt from the modem 30 to which it is coupled. However, if the routine is stopped, it can be restarted by calling MTSTART.

First the routine checks to see if TxBuf is empty. If so, there is no data to transmit, and therefore if the status MTxStatus of the routine is not equal to STOP, MTxStatus is set equal to IDLE, and the routine exits.

Similarly, if the status MTxStatus is equal to STOP and the next character to be transmitted (pointed to by TxPtr) is the first character of a new data packet, then the routine exits because a STOP status means that the receiving data compression unit has requested that no more data packets be sent. Note, however, that is there are any control packets in TxBuf, these will be at the top of the TxBuf list and these will be transmitted even if MTxStatus is equal to STOP.

Assuming that the routine has now decided to transmit data, the character in TxBuf pointed to by TxPtr is sent to the modem 30, and the time counter MTxIdle is set equal to zero—to indicate that the Modem Transmit routine has been active recently.

If the character just transmitted was not the last character of a packet, TxPtr is incremented. MTxStatus is set equal to ACTIVE if it is not already equal to STOP.

If the character just transmitted was the last character of a packet, then the packet is purged from TxBuf if it was a control packet, and it is put in TxHold (by adding the packet to the TxHold list as shown in FIG.

Figure 18:
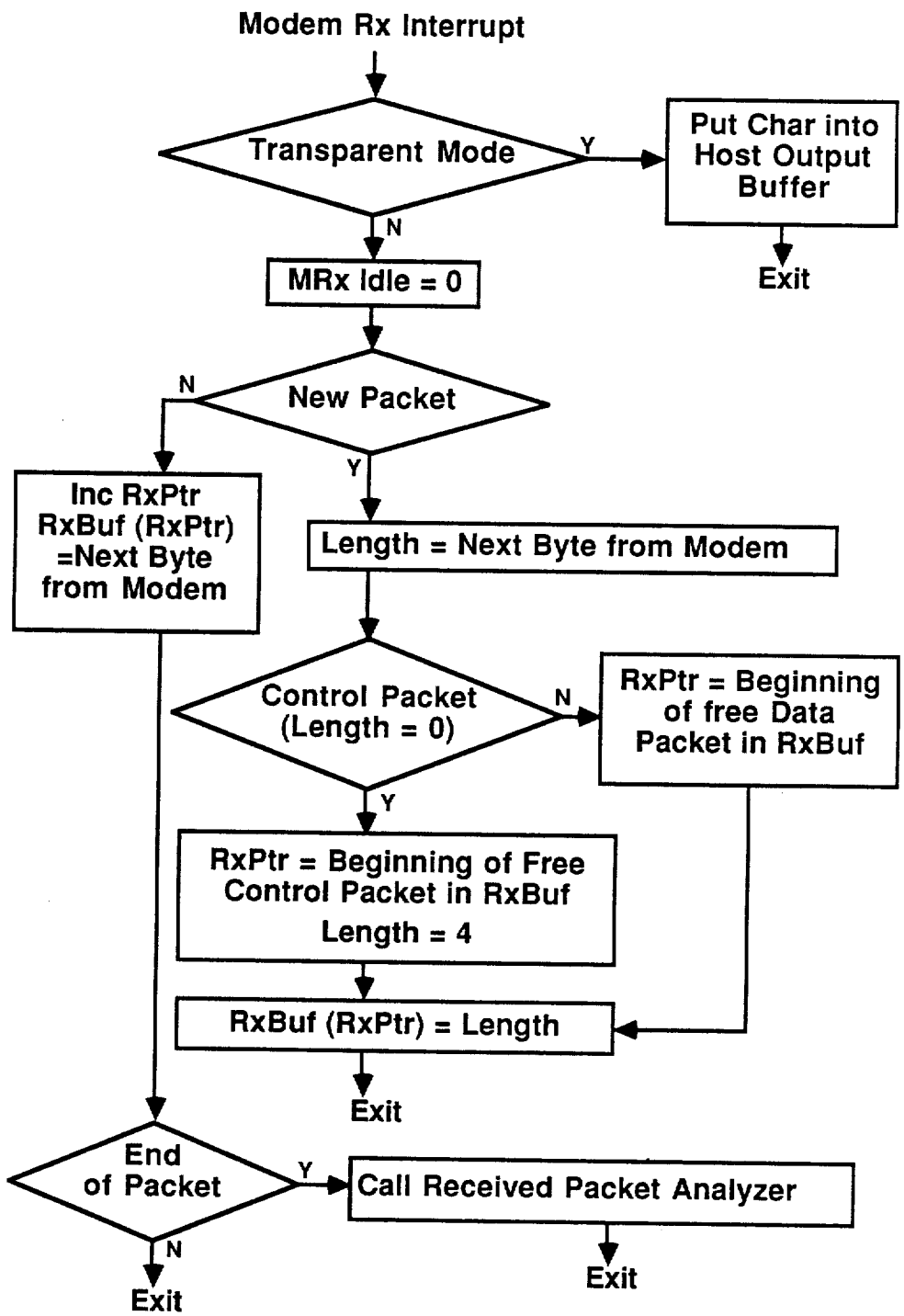
FIG. 18 is a flow chart of the Modem Rx Interrupt routine for receiving data from a communication channel.

10) if it was a data packet. In any case, TxPtr is set to the top of the next packet in TxBuf, if any, and then MTxStatus is set equal to ACTIVE if it is not already equal to STOP Detailed Explanation of Data Decompression Method Modem Rx Interrupt. Referring to FIG. 18, the routine for receiving data from the modem 30 is driven by interrupts from the modem. This routine always responds to interrupts from the modem—it does not have a STOP status.

Figure 20:
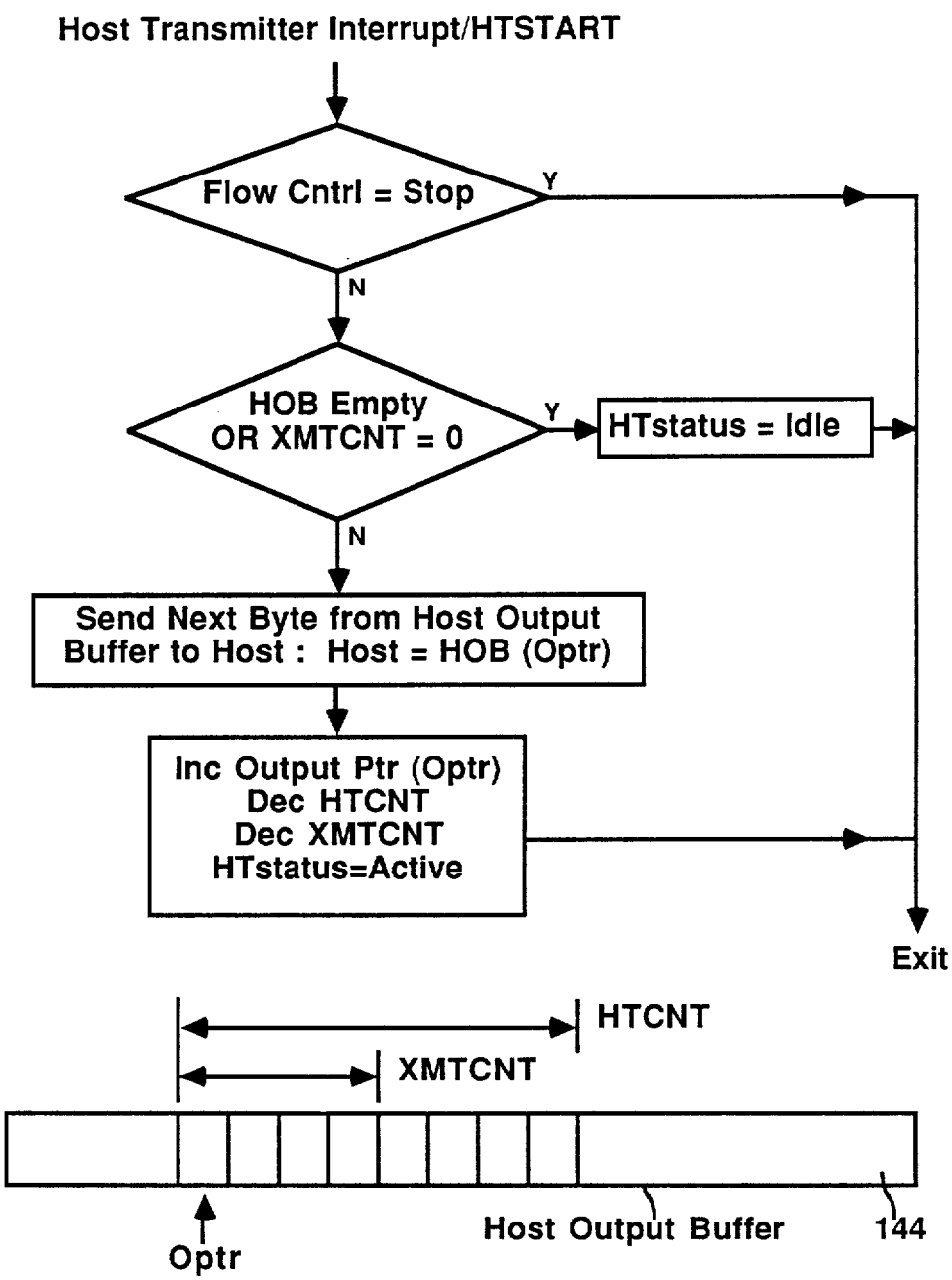
FIG. 20 is a flow chart of the Host Transmitter Interrupt/HTSTART routine for sending decoded data to a host computer.

If the data compression unit is in transparent mode, the received character is simply placed in the Host Output Buffer where it will be kept until the host computer picks it up through the Host Transmit routine (see FIG. 20).

First the routine sets the timer counter MRxIdle to zero, and checks to see if the "character" (actually a byte of compressed data) just received is the first character of a new packet. If not, the pointer RxPtr to the location in RxBuf for storing encoded data is incremented and the byte of data just received is stored at that location.

If the byte of data just received is the last byte of a packet the Packet Analyzer routine (see FIG. 19) is called.

If the byte of data just received is the first byte of a new packet, this byte is equal to zero if it is the beginning of a control packet and is equal to the length of the following data packet otherwise.

RxPtr is set to point to the first byte of an empty slot in either the control packet array 164 or the data packet array 160, as appropriate, and then the received byte is stored at this location (except that the length indicating byte is set equal to four for control packets).

Figure 19:
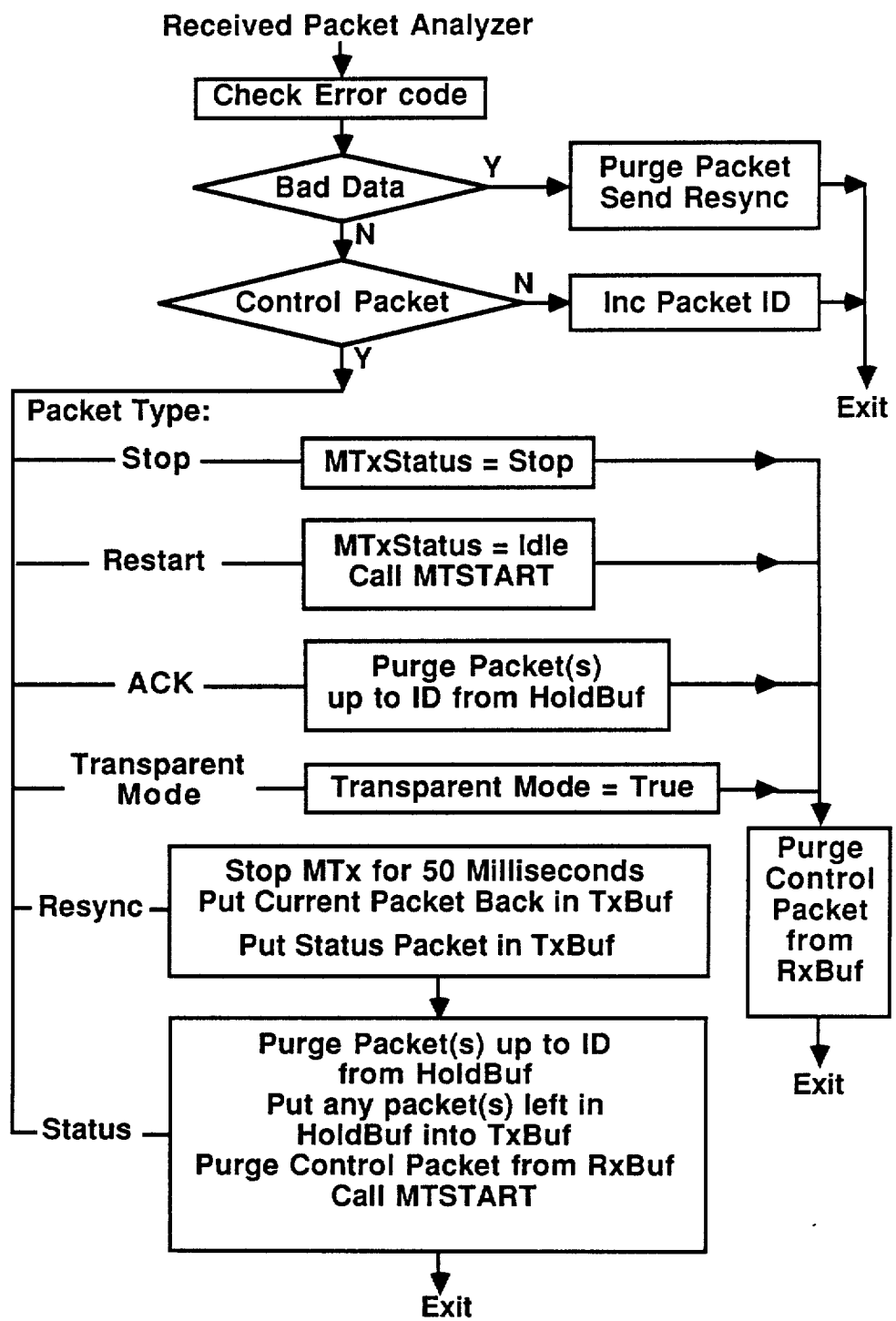
FIG. 19 is a flow chart of the routine for analyzing packets received from a communication channel.

Received Packet Analyzing Routine. Referring to FIG. 19, the routine for analyzing packets is called whenever the last byte of a packet has been received. First this routine checks to see if any of the data in the packet was lost or corrupted by computing the CRC-16 for the packet and comparing it with the CRC sent as the last two bytes of the packet. If the data contains errors, the packet is purged from RxBuf and a Resync control packet is sent (by putting a Resync control packet at the top of the TxBuf list) so that the transmitting compression unit will know that bad data was received.

If good data was received, and the packet is a data packet, then the ID indicator used for identifying the last good packet received is incremented (note that this ID is included in every control packet sent by the data compression unit 20).

If, however, a control packet was received, the instructions in the control packet must be interpreted immediately. If the received control packet is a Stop packet, MTxStatus is set equal to STOP so the Modem Transmit routine will not send any additional data packets until a Restart control packet is received.

When a Restart control packet is received, MTxStatus is set equal to IDLE, and MTSTART is called to reactivate the Modem Transmit routine.

When an ACK control packet is received, all of the data packets up to and including the specified ID number are purged from the TxHold buffer. ACK packets indicate that the data compression unit on the other end of the channel 26 successfully received the packet with the specified ID.

If a Transparent Mode control packet is received, the Transparent mode flag is set equal to True, and from then on the unit will operate in transparent mode—as described above.

Host Transmitter Interrupt/HTSTART. Referring to FIG. 20, the Host Transmitter routine is an interrupt routine driven by interrupts from the host computer's input data port. When the routine is called, a flag called FlowCntrl is checked to see if the host computer has asked that no more data be sent to it. If so, the routine simply exits. Otherwise the routine checks to see if the Host Output Buffer is empty, or if a special counter called XMTCNT is equal to zero. If either is true, then HTstatus is set equal to IDLE and the routine exits.

The XMTCNT counter is used to smooth the flow of data into the host computer. This is particularly useful if the data is being displayed to a human observer because it makes the flow of data onto his display appear to be fairly even and therefore easy to scan. If this smoothing is not done, the flow of data into the host is very uneven and difficult to view on a display.

The XMTCNT counter is reset to a positive value every 32 milliseconds by the Real Time Clock routine and is decremented when characters are sent to the host computer. In this way, the number of characters sent to the host computer during each 32 millisecond period can be controlled. It should be noted that this smoothing does not slow the overall rate at which data is sent to the host computer (see FIG. 21).

If the routine has not exited because of the above described tests, the next byte in the Host Output Buffer is sent to the host computer, the Host Output Buffer is updated by incrementing its output pointer and decrementing the count of the number of characters left in the buffer, XMTCNT is decremented, and the status of this routine HTstatus is set equal to ACTIVE.

Figure 21:
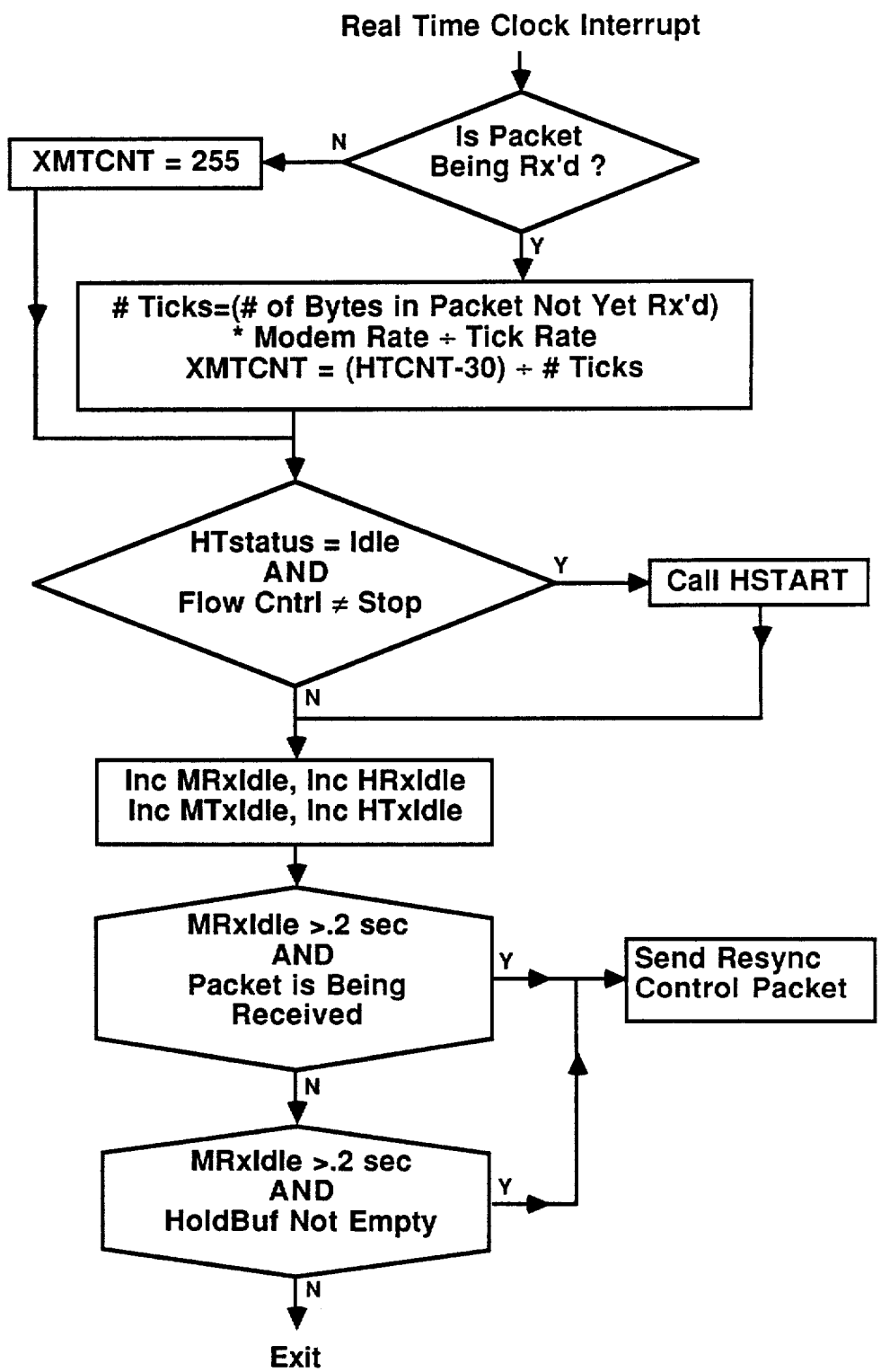
FIG. 21 is a flow chart of the Real Time Clock Routine used in the preferred embodiment.

Real Time Clock Routine. Referring to FIG. 21, the Real Time Clock routine 152 is called by a clock interrupt once every 32 milliseconds. The routine begins by updating the smoothing counter XMTCNT. It does this by setting XMTCNT equal to 255 if a packet is not in the process of being received. Otherwise XMTCNT is set equal to the number of characters in the Host Output Buffer, minus thirty, divided by the number of clock cycles it will take to finish receiving the packet currently being received. This allows the Host Transmit routine to smoothly send out the contents of the Host Output Buffer while the next packet is being received. The margin of thirty characters is used to make sure there are a few characters left to send while the new packet is being decoded.

Next, if the Host Transmit routine is IDLE and FlowCntrl is not equal to STOP, the Host Transmit routine is restarted by calling HTSTART.

Then the timer counters for the Modem Receiver, Host Receiver and Modem Transmitter routines are all incremented.

The Modem Receiver timer, MRxIdle, is checked to to see if the Modem Receiver routine has been idle for more than 0.2 seconds while a packet is in the middle of being received. If so, a portion of the packet has probably been lost and the routine sends a Resync control packet by putting a Resync control packet at the top of TxBuf.

The Modem Transmitter timer, MTxIdle, is checked to see if the Modem Transmitter routine has been idle for more than 0.5 seconds even though the TxHold buffer is not empty. If this happens, it means that the receiving data compression unit has either not received the data packets in the Txhold buffer, or the ACK packet from the receiving data compression unit was lost. In either case, the two data compression units need to resynchronize and therefore a Resync control packet is sent to the other data compression unit.

Note that when a Resync control packet is sent, the following sequence of events happens. First, the data compression unit stops all data transmission for a predetermined period of time (e.g., 100 milliseconds). Then it sends the control packet. While not shown in FIG. 18, the receiving data compression unit knows that if it sees a gap in the data transmission for this predetermined period of time, then the following four bytes may be a Resync control packet. Thus, after such a transmission gap the Modem Receiver routine checks the next four bytes received to see if it is a Resync control packet, and if it is, it responds by sending a Status control packet back to the other data compression unit.

Alternate Embodiments of the Invention

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For instance, it will be clear to those skilled in the art that the present invention can be used in a number of different computer and channel configurations. For instance, the present invention could be incorporated in a compression enhanced modem, or a compression enhanced multiplexor (which might or might not include a built-in modem). The present invention could be implemented as a plug-in board for use in a computer, personal computer or computer terminal. With adjustments to the protocols for resynchronization and handling transmission errors, the present invention could be used in multiport systems in which multiple stations receive compressed data transmitted by a single transmitting computer.

What is claimed is:

1. A data compression system for use in a data transmission system for transmitting data over a data communication channel between first and second data processing systems, comprising:
   a first data compression unit coupling said first data processing system to said channel and a second data compression unit coupling said second data processing system to said channel, both data compression units including:
   host receiving means for receiving host input data comprising sequences of binary data from the data processing system coupled to said data compression unit;
   data encoding means for encoding said input data, including
      a plurality of encoding tables, each said table defining a method of encoding data using codes whose length varies inversely with the frequency of units of data in a predefined set of data;
      means for encoding said input data using a selected one of said encoding tables and thereby producing encoded data;
      encoding table building means for building a new encoding table to be including in said plurality of encoding tables using a preselected portion of the previously encoded input data, including
         means for determining when to perform said table building; and
      encoding table change means for selecting from among said encoding tables the one which minimizes the bit length of the encoded data for a preselected sample of said input data, including
         means for determining when to perform said table selection; and
         means for adding to said encoded data a table change code which corresponds to said selected table, including means for indicating when said selected table is a new encoding table built by said table building means;
   channel transmitting means for transmitting said encoded data over said channel;
   channel receiving means for receiving encoded data;
   data decoding means for decoding said encoded data, including
      a plurality of decoding tables, each said decoding table defining a method of decoding data which was encoded using codes whose length varies inversely with the frequency of units of data in a predefined set of data;
      means for decoding said encoded data using a selected one of said decoding tables and thereby producing decoded data;
      decoding table building means for building a new decoding table to be including in said plurality of decoding tables using a preselected portion of previously decoded data, including
         means for initiating the performance of said table building when said encoded data includes a table change code which indicates that the encoded data following said table change code was encoded using a new encoding table; and
      decoding table change means for selecting a new decoding table from among said plurality of decoding tables when said encoded data includes a table change code;
   host transmitting means for transmitting said decoded data to the data processing system coupled to said data compressing unit.

2. A data compression system as set forth in claim 1, wherein said means for determining when to perform said table selection in said encoding table change means includes
   means for initiating the performance of said table selection if the bit length of said encoded data exceeds a predefined function of the bit length of said input data.

3. A data compression system, comprising:
   encoding means for encoding input data received from a first data processing system in accordance with a predefined data compression encoding scheme; wherein said first data processing system requires acknowledgement of receipt of predefined quantities of said input data before it will send more of said input data to said encoding means;
   modem transmission means for transmitting the encoded representation of said input data generated by said encoding means over a communication channel to a second data processing system; said modem transmission means being able to transmit one set of encoded data at the same time that said encoding means is receiving and encoding a different set of input data;

hold buffer means for storing said transmitted data;

buffer purging means for purging data from said hold buffer means when an acknowledgement of the receipt of said transmitted data is received from said communication channel;

retransmitting means for retransmitting over said communication channel said data in said hold buffer means if receipt of said transmitted data is not acknowledged; and protocol emulation means for sending to said first data processing system an acknowledgement of the receipt of said input data before said encoded data is transmitted over said communication channel;

whereby the transmission of data from said first data processing system to said second data processing system is not delayed by said first data processing system waiting for an acknowledgement of receipt of said data to be sent by said second data processing system.

4. A data compression system, comprising:

input buffer means for storing input data received from a first data processing system;

encoding means for encoding said input data received from said first data processing system in accordance with a predefined data compression encoding scheme;

packet means for accumulating encoded data from said encoding means and generating packets, including packet sizing means for stopping the accumulation of encoded data for a packet (a) when the quantity of encoded data exceeds a defined packet limit, and (b) when all of said input data has been encoded by said encoding means, and no input data is received by said encoding means for a predefined length of time, said packet means including means for adding a transmission error detection code to each said packet;

modem transmission means for transmitting said data packets of encoded data over a communication channel to a second data processing system at a predefined transmission rate, including means for transmitting a packet of encoded data at the same time that said encoding means is receiving and encoding input data;

wherein said second data processing system can accept decoded data at a predefined data reading rate; and said packet sizing means includes means for stopping the accumulation of encoded data for a packet, when said modem transmission means is not transmitting a packet of data, and the lenght of time it will take for said second data processing system to accept the input data already encoded and accumulated by said encoding means and packet means, at said predefined data reading rate, is greater than the length of time it will take to transmit over said channel, at said predefined transmission rate, the input data stored in said input buffer but not yet encoded by said encoding means.

5. A data compression system as set forth in claim 4, wherein said defined packet limit is increased by a predefined growth ratio each time the accumulation of data for a packet of data is ended by said packet means, until said defined packet limit reaches a predefined maximum packet size limit.

6. A data compression system as set forth in claim 5, wherein said predefined growth ratio is equal to the ratio of said predefined data reading rate, measured in units of data per period of time, to said predefined data transmission rate multiplied by a number corresponding to an estimate of said system's average data compression ratio.

7. A data compression system as set forth in claim 5, further including, modem receiving means coupled to said communication channel for receiving data transmitted by said second data processing system over said communication channel, including acknowledgement data which indicates whether said second data processing system, using said transmission error detection code in each said packet, detected any transmission errors in said data packets sent to said second data processing system;

wherein said packet means includes means for decreasing said defined packet data limit in accordance with a predefined algorithm each time said data compression system receives acknowledgement data indicating that the data received by said second data transmission system included one or more transmission errors.

8. A data compression system, comprising:

encoding means for encoding input data received from a first data processing system in accordance with a selected character by character data compression encoding scheme;

modem transmission means for transmitting an encoded representation of said input data over a communication channel;

history buffer means for storing at least a portion of said input data which has been encoded by said encoding means;

character substitution encoding means for finding the longest string of data in said history buffer which matches said input data, and, if said longest string meets a predefined length requirement, representing said input data with a string substitution code including a pointer to the portion of said history buffer with said matching string, and a length indicator of the length of said matching string;

whereby some of said transmitted data is encoded on a character by character basis and some of said transmitted data is encoded with a string substitution code; and a receiver of said transmitted data can decode said transmitted data by maintaining a history buffer identical in content to said history buffer means in said data compression system, and by separately decoding said transmitted data in accordance with whether said data is encoded on a character by character basis or by a character substitution code.

9. A data compression system as set forth in claim 8, further including:

data receiving means for receiving encoded data and for decoding said received encoded data, including a receiving history buffer for storing at least a portion of said received data which has been decoded and means for decoding each said string substitution code in said received data into a string of data stored in the portion of said receiving history buffer specified by said pointer and length indicator in said string substitution code.

10. A data compression system as set forth in claim 8, said character substitution encoding means including:

hash table means for locating strings of length N in said history buffer including: a hash function for generating a hash value when said hash function is applied to a string of length N, wherein N is an integer greater than one; a hash table of pointers to each string of length N stored in said history buffer, wherein each said pointer is stored at a location in said hash table corresponding to said hash value of the corresponding string of length N; and locating software means using said hash function and said hash table to locate every string in said history buffer starting with a specified string of length N.

11. A data compression system for encoding and transmitting data to a data decoding system that can simultaneously receive encoded data and decode previously received encoded data, comprising:
input buffer means for storing input data received from a data processing system;
encoding means for encoding said input data received from said data processing system in accordance with a predefined data compression encoding scheme;
packet means for accumulating encoded data from said encoding means and generating packets, including packet sizing means for stopping the accumulation of encoded data for a packet (a) when the quantity of encoded data exceeds a defined packet limit, and (b) when all of said input data has been encoded by said encoding means, and no input data is received by said encoding means for a predefined length of time;
modem transmission means for transmitting said data packets of encoded data over a communication channel to said data decoding system at a predefined transmission rate, including means for transmitting a packet of encoded data at the same time that said input buffer means and said encoding means are receiving and encoding input data;
wherein said packet sizing means further includes downsizing means for detecting the end of a data transmission and then decreasing the size of said packets generated by said packet means so that the data decoding system receiving said packets will simultaneously receive encoded packets of data from said end of said data transmission while decoding previously received data packets;
whereby the last datum at the end of said data transmission will be decoded sooner than if the size of said packets were not decreased.

12. A data compression system as set forth in claim 11, wherein said downsizing means successively decreases the size of each succeeding packet after detecting the end of a data transmission.

13. A data compression system as set forth in claim 12, wherein each packet at the end of said data transmission is sized so that the length of time it will take for said data decoding system to decode the data already encoded and accumulated by said encoding means and packet means is approximately equal to the length of time it will take to transmit over said channel the input data stored in said input buffer but not yet encoded by said encoding means.

14. A data compression system for encoding and transmitting data to a data decoding system that can simultaneously receive encoded data and decode previously received encoded data, comprising:
input buffer means for storing input data received from a data processing system;
encoding means for encoding said input data received from said data processing system in accordance with a predefined data compression encoding scheme;
packet means for accumulating encoded data from said encoding means and generating packets, including packet sizing means for stopping the accumulation of encoded data for a packet (a) when the quantity of encoded data exceeds a defined packet limit, and (b) when all of said input data has been encoded by said encoding means, and no input data is received by said encoding means for a predefined length of time;
modem transmission means for transmittng said data packets of encoded data over a communication channel to said data decoding system at a predefined transmission rate, including means for transmitting a packet of encoded data at the same time that said input buffer means and said encoding means are receiving and encoding input data;
wherein said defined packet limit has a predefined initial value and is increased by a predefined growth ratio each time the accumulation of data for a packet of data is ended by said packet means, until said defined packet limit reaches a predefined maximum packet size limit.

15. A data compression system as set forth in claim 14,
wherein said packet sizing means further includes downsizing means for detecting the end of a data transmission and then decreasing the size of said packets generated by said packet means so that the data decoding system receiving said packets will simultaneously receive encoded packets of data from said end of said data transmission while decoding previously received data packets;
whereby the last datum at the end of said data transmission will be decoded sooner than if the size of said packets were not decreased.

16. A data compression system as set forth in claim 14, wherein said downsizing means successively decreases the size of each succeeding packet after detecting the end of a data transmission so that each packet at the end of said data transmission is sized so that the length of time it will take for said data decoding system to decode the data already encoded and accumulated by said encoding means and packet means is approximately equal to the length of time it will take to transmit over said channel the input data stored in said input buffer but not yet encoded by said encoding means.

17. A data compression system as set forth in claim 14, wherein said encoding means includes:
history buffer means for storing at least a portion of said input data which has been encoded by said encoding means; and
character substitution encoding means for finding the longest string of data in said history buffer which matches said input data, and, when said longest string meets a predefined length requirement, representing said input data with a string substitution code including a pointer to the portion of said history buffer with said matching string, and a length indicator of the length of said matching string.

* * * * *